(12) United States Patent
Davies

(10) Patent No.: US 7,847,350 B2
(45) Date of Patent: Dec. 7, 2010

(54) TRANSISTOR STRUCTURE HAVING A TRENCH DRAIN

(75) Inventor: Robert Bruce Davies, Tempe, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 146 days.

(21) Appl. No.: 12/248,803

(22) Filed: Oct. 9, 2008

(65) Prior Publication Data

US 2010/0090269 A1    Apr. 15, 2010

(51) Int. Cl.
*H01L 29/94* (2006.01)
(52) U.S. Cl. .................................. 257/341; 257/E29.03
(58) Field of Classification Search ................. 257/328, 257/341, E29.03
See application file for complete search history.

(56) References Cited

U.S. PATENT DOCUMENTS

2002/0185679 A1*   12/2002   Baliga ......................... 257/329
2005/0001268 A1*   1/2005   Baliga ......................... 257/341

* cited by examiner

*Primary Examiner*—Thomas L Dickey
(74) *Attorney, Agent, or Firm*—Cool Patent, P.C.; Kenneth J. Cool

(57) ABSTRACT

A semiconductor device is formed having a trench adjacent to a current carrying region of the device. The trench is formed having a depth greater than the depth of a tub region of the device. Increasing the trench depth moves a region of higher field strength from the tub region to a region along the trench. The region along the trench does not have a junction and may withstand the higher field strength.

14 Claims, 16 Drawing Sheets

TRANSISTOR STRUCTURE HAVING A TRENCH DRAIN

TECHNICAL FIELD

The disclosure herein generally relates to a semiconductor device, and more particularly relates to a transistor having a trench drain.

BACKGROUND

Transistors are designed to operate over a wide variety of conditions depending on the application. In many applications, the transistor is the limiting factor on the performance that may be obtained in a system. Also, the transistor may contribute significantly to the overall power dissipation or efficiency of the system.

In general, increasing the transistor power density is one path to increasing device performance. Increasing the power density of a transistor reduces the size required to deliver a predetermined power level. Typically, a making the physical size of the die smaller results in corresponding reduction in device parasitics. Higher switching frequencies, higher operating frequency, and/or wider bandwidth are examples of improved performance of the transistor. On-resistance per unit area also decreases due the increased packing density of transistors. Increasing the number of devices that may be manufactured on a wafer may also result in a reduced cost of manufacture. However, increasing power density cannot be at the expense of device breakdown voltage or effective removal of heat away from the transistor.

BRIEF DESCRIPTION OF THE DRAWINGS

The claimed subject matter will hereinafter be described in conjunction with the following drawing figures, wherein like numerals denote like elements, in which:

DETAILED DESCRIPTION

Figure 1:
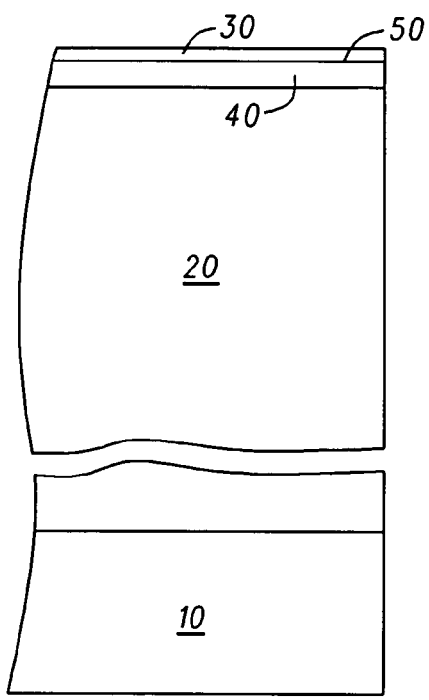
FIGS. 1-19 are exploded cross-sectional views of a portion of a transistor in accordance with one or more embodiments.

The following detailed description is merely in nature and is not intended to limit the claimed subject or the application and uses thereof. Furthermore, there is no intention to be bound by any expressed or implied theory presented in the preceding technical field, background, brief summary and/or the following detailed description.

In all of the examples illustrated and discussed herein, any specific materials, temperatures, times, energies, and so on, for wafer processes or specific structure implementations should be interpreted to illustrative only and non-limiting. Processes, techniques, apparatus, and materials as known by one of ordinary skill in the art may not be discussed in detail but are intended to be part of an enabling description where appropriate. Similar reference numerals and letters may refer to similar items in the following figures.

Referring now to FIGS. 1-19, exploded cross-sectional views of a partial transistor (referred to as the transistor) that sequentially illustrate wafer processes to form the device in accordance with one or more embodiments will be discussed. The wafer process flow is for illustration purposes and both n-channel and p-channel transistors may be formed. It is understood that wafer fabrication occurs on semiconductor wafers comprising more than one die. In general, the wafer processes described herein below are illustrated for the transistor in the figures but would occur over all wafer since a die being manufactured commercially is typically repeated over the entire wafer.

In general, a transistor may have a first electrode, a control electrode, and a second electrode. A bias voltage applied to the control electrode controls a channel region that couples the first electrode to the second electrode. The voltage magnitude applied to the control electrode corresponds to the current conducted by the transistor and is affected by other factors such as the voltage differential across the first and second electrodes and thermal considerations. In one or more embodiments, a fourth electrode may be included in the transistor to further enhance device performance. The claimed subject matter described herein below is applicable to field effect transistors, bipolar transistors, and/or other three terminal devices, although the scope of the claimed subject matter is not limited in these respects.

A field effect transistor has a drain, a gate, and a source that corresponds respectively to a first electrode, a control electrode, and a second electrode. The gate overlies a channel region that couples the drain to the source. In an enhancement mode device, a conduction path between drain and source is formed when a voltage above a threshold voltage is applied to the gate. Conversely, in a depletion mode device, the conduction path exists between drain and source without a voltage being applied to the gate. A voltage applied to the gate enhances or reduces the conduction path. The claimed subject matter described herein below is applicable to enhancement and depletion mode field effect transistors, although the claimed subject matter is not limited in these respects.

A power transistor may be formed as one large transistor. For example, a field effect transistor having a single drain region, single gate, and a single source region. Similarly, a bipolar transistor having a single collector region, single base region, and a single emitter region. Alternately, a power transistor may be formed as more than one transistor such that the first electrodes are coupled in common, the control electrodes are coupled in common, and the second electrodes are coupled in common. In the one or more embodiments, a further refinement to improve device density is used. One of the electrodes is a single region. An example of this is a field effect transistor having the drain region as a single region of the power transistor. The field effect transistor further includes more than one source region that are coupled in common and more than one gate that are coupled in common. In at least one or more embodiments, the transistor described herein below may be applicable to power transistors formed as a single large device or more than one transistor coupled in common.

In at least one or more embodiments, an n-channel metal-oxide field effect transistor (MOSFET) may be used for purposes of illustration. The transistor may be other types of field effect transistors or bipolar transistors. The claimed subject matter is also not limited to an n-type device such as an npn transistor or n-channel transistor but encompasses other channel types including pnp transistors and p-channel transistors. Furthermore, a cross-section of a partial transistor is used to illustrate the wafer process used to form a high performance transistor. The partial transistor may be scaled to form a single large transistor or a group of transistor cells coupled in parallel to form a larger device. For example, a group of fingered transistor cells or serpentine transistor cells may be formed having separate drain and source regions which are respectively coupled together (drain-to-drain/source-to-source) to form a larger device. Alternately, the group of transistor cells may be formed having a common region such as the drain or source. The example shown herein below in one or more embodiments may comprise a device structure having a common drain region. The common drain configuration is shown to illustrate a dense transistor structure suitable for a power transistor. It is well understood by one skilled in the art that separate drain structures may be formed to create more than one transistor that are independent from one another.

Referring to FIG. 1, a starting material for forming a device will be discussed. The starting material is substrate 10. For illustration purposes an n-channel device is formed overlying substrate 10. In at least one embodiment of the wafer process, substrate 10 is an arsenic doped silicon substrate having a <100> crystal orientation. In at least one embodiment, substrate 10 is a low resistance material having a sheet resistance of 0.003 ohm-centimeter. In at least one embodiment, an n-type layer 20 is formed overlying substrate 10. In at least one embodiment, n-type layer 20 is an epitaxial layer formed on substrate 10 having a phosphorous concentration of $2.5 \times 10^{15}$ atoms/cm$^3$ grown to a thickness of approximately 8.50 microns. In general, the thickness and/or resistivity of n-type layer 20 may vary depending on the desired voltage breakdown of the device. The selection of n-type layer 20 may be chosen to reduce or minimize device on-resistance while meeting the breakdown voltage specification of the device. In at least one embodiment, n-type layer 20 is targeted for breakdown voltage in the 100-150 volt range for the thickness disclosed herein above. In general, increasing the thickness of n-type layer 20 for a given/selected material resistivity may result in a higher voltage breakdown for the device. Thus, the breakdown voltage of a device may be scaled, within limits, by modifying the thickness of n-type layer 20 without significantly modifying the device structure. It should be noted and taken into account that subsequent thermal processes may change the resistivity and the thickness of n-type layer 20. Although this embodiment utilizes a silicon substrate, the claimed subject matter is not limited to silicon. For example, the device could be formed in substrates such as silicon-germanium, silicon-germanium-carbon, gallium nitride, silicon carbide, gallium arsenide, carbon doped silicon, or the like.

As illustrated, the n-type layer 20 forms the drain region of the device. In this embodiment, multiple transistors formed in n-type layer 20 may have a common drain. Alternately, an n-channel device could be formed in a p-type material. Separate n-type source and drain regions using standard implant or diffusion techniques may be used to build devices where the drains are not common. A larger device may be formed by coupling the independent transistors in parallel with one another. In the illustrated embodiment, having a common drain may increase the density in which transistors may be packed thereby decreasing die size and device parasitics.

A dielectric layer 30 is formed overlying epitaxial layer 20. In at least one embodiment, dielectric layer 30 is a silicon dioxide layer. The silicon dioxide layer is thermally grown and forms an oxide layer of approximately 100 angstroms. In at least one embodiment, a layer 40 is formed below a major surface 50 of layer 20. In at least one embodiment, n-type doping is implanted through dielectric layer 30 to form n-type layer 40. In at least one embodiment, the n-type doping is arsenic and is used to minimize movement of n-type layer 40 away from major surface 50 due to subsequent thermal processes. N-type layer 40 improves current density of the device and is present at the channel-drain interface of the device. The selection of the doping concentration of n-type layer 40 is a tradeoff between device current density and device voltage breakdown. In at least one embodiment, the implanted arsenic dose to form n-type layer 40 is $2 \times 10^{12}$ atoms/cm$^3$ and is implanted at 80 keV.

Figure 2:
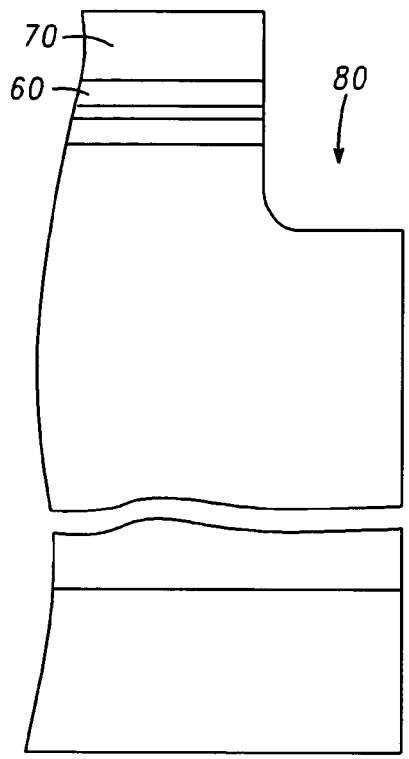

Referring to FIG. 2, an etched region or trench 80 is formed in n-type layer 20. A dielectric layer 60 is formed overlying dielectric layer 30. In at least one embodiment, dielectric layer 60 is deposited silicon nitride formed approximately 1500 angstroms thick. Dielectric layers 30 and 60 protect major surface 50 of n-type layer 20 from subsequent wafer processes. In general, a dielectric stack comprising a first dielectric material and a second dielectric material is used to isolate one region of the transistor from another throughout the wafer process disclosed hereinbelow.

A photoresist layer 70 is deposited overlying dielectric layer 60. Photoresist layer 70 is exposed in a masking process in predetermined areas to form a pattern on the die. Photoresist layer 70 is removed exposing dielectric layer 60 in predetermined areas. The area where photoresist layer 70 is removed corresponds to the area where trench 80 is formed.

Exposed dielectric layers 60 and 30 are removed exposing major surface 50 of n-type layer 20. A trench 80 is then etched into n-type layer 20. Trench 80 has a surface 90 below major surface 50 and a sidewall surface 100. In at least one embodiment, trench 80 is etched to a depth of approximately 1 micron. Trench 80 forms a physical boundary of a drain region of the transistor for current flow in the lateral direction. The depth of trench 80 may affect the current density and voltage breakdown tradeoff of the transistor. The depth of trench 80 will be discussed in more detail herein below as more of the device is shown and described in later figures.

Figure 3:
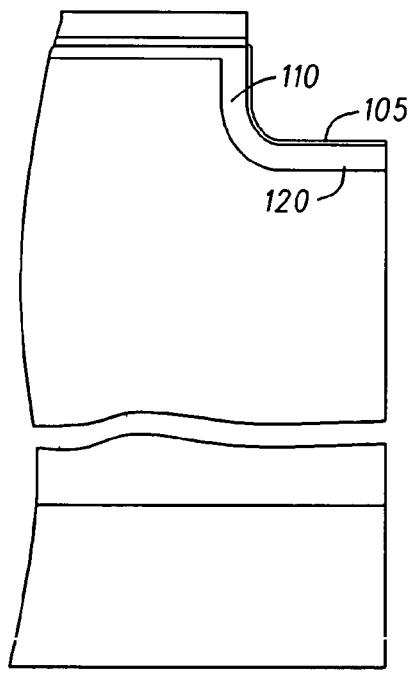

Referring to FIG. 3, an n-type layer 110 is formed parallel to sidewall 100 of trench 80 will be discussed. N-type layer 110 increases the current density/voltage breakdown tradeoff of the transistor. As mentioned hereinabove, trench 80 is a physical barrier for lateral current flow from the transistor. Trench 80 is spaced a predetermined distance "d" from the channel/drain interface of the transistor. Minimizing the distance between trench 80 and the channel/drain interface will increase the transistor packing density and lower the cost of manufacture. The current output at the channel/drain interface of the device spreads both laterally and vertically into the n-type layer 20.

A dielectric layer 105 is formed overlying trench 80. In at least one embodiment, dielectric layer 105 is a thermally grown silicon dioxide layer formed approximately 100 angstroms thick. In at least one embodiment, n-type layer 110 is formed by an implant phosphorous dose of $4.66e^{11}$ atoms/cm$^3$ at an energy of 190 keV. N-type layer 110 increases current flow by adding n-type dopant within the space restricted drain region defined by trench 80 and the channel/drain interface of the transistor. In at least one embodiment, n-type layer 110 is contiguous along sidewall 110. N-type layer 110 also improves the voltage breakdown of the device in combination with a fourth electrode of the transistor that will be described in more detail herein below. A predetermined voltage breakdown of the transistor is achieved at a higher current density or improved packing density using n-type layer 110 by reducing field curvature within the trench 80 to channel/drain interface region. In one or more embodiments, planar breakdown where the field lines in n-type layer 20 have no curvature may be achieved which results in the minimum, or nearly minimum, thickness of n-type layer 20 to standoff the predetermined voltage (breakdown voltage) of the transistor thereby yielding the lowest, or nearly lowest, on-resistance for the device.

In at least one embodiment, n-type layer 110 is formed in trench 80 using an angled implant to form n-type layer 110 along sidewall surface 100. In at least one embodiment, the dopant is implanted at a 60 degree angle. More than one angled implant at different angles may be used to achieve a desired doping profile of n-type layer 110. In general, trench 80 may have multiple sidewalls oriented differently on the die and each sidewall will have a corresponding implant to ensure the sidewalls are uniformly doped and consistent with one another. For example, trench 80 formed in a square or rectangle would involve a minimum of four implants to ensure all the sidewalls are doped consistently with one another. An artifact of forming n-type layer 110 is that a n-type layer 120 is formed underlying surface 90 of trench 80.

The amount of charge provided by n-type layer 40 for the transistor is subject to variation depending on alignment tolerances in the wafer processing. In other words, a distance "d" between the channel/drain interface and trench 80 will vary from wafer to wafer and wafer lot to wafer lot. The result of this variation would be a wide distribution of device performance characteristics. N-type layer 110 reduces the variation in charge due to alignment tolerances resulting in a tighter distribution of performance characteristics which improves device yield and lowers manufacturing cost.

Figure 4:
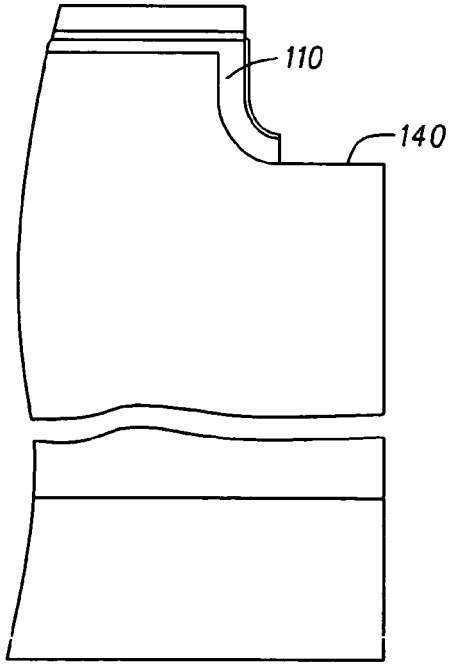

Referring to FIG. 4, n-type layer 120 is removed in accordance with one or more embodiments. N-type layer 120 is formed at the same time as n-type layer 110. N-type layer 120 potentially may decrease performance of the transistor if not removed or modified. In at least one embodiment, n-type layer 120 is removed by etching. An anisotropic etch is performed on dielectric layer 105 such that dielectric layer 105 is removed in the area corresponding to surface 90 of trench 80. Surface 90 of n-type layer 20 is exposed. A silicon etch is then performed. In at least one embodiment, trench 80 is further etched approximately 0.25 microns such that n-type layer 120 is removed. A surface 140 in trench 80 is exposed by the etching. In at least one embodiment, surface 140 is at a maximum depth from major surface 50. An alternate embodiment will be illustrated hereinbelow where an additional trench is etched. In at least one embodiment, the additional trench may be used to form an isolated transistor or isolated transistor cell. Furthermore, when the surface of the additional trench is oxidized it will provide edge termination for the field lines in n-type layer 20 to enhance device breakdown voltage.

Figure 5:
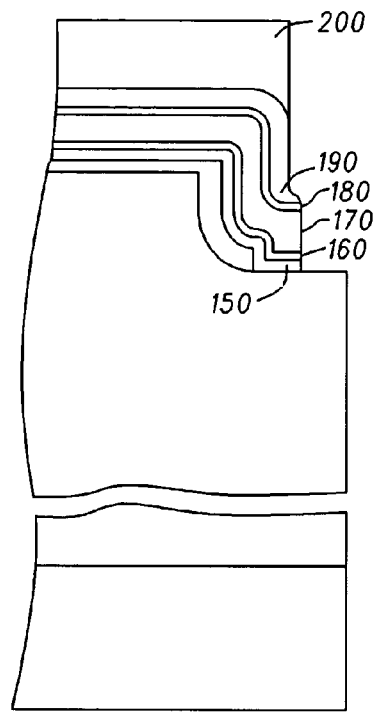

Referring to FIG. 5, a forth electrode is formed in trench 80 and overlying major surface 50 in accordance with one or more embodiments. A dielectric stack isolates the forth electrode from n-type layer 20. Similarly, a dielectric stack also overlies the forth electrode to isolate the forth electrode from subsequent materials applied onto the die during the wafer process. A dielectric layer 150 is formed overlying trench 80. In at least one embodiment, dielectric layer 150 is a thermally grown silicon dioxide layer formed approximately 1200 angstroms thick. Dielectric layer 60 is then removed exposing dielectric layer 30.

A dielectric layer 160 is formed overlying dielectric layer 30 and dielectric layer 150. In at least one embodiment, dielectric layer 160 is a layer of deposited silicon nitride formed approximately 500 angstroms thick. A conductive layer 170 is formed overlying dielectric layer 160. In at least one embodiment, conductive material 170 is a phosphorous doped polysilicon deposited approximately 1250 angstroms thick. Other conductive materials such as metal, silicides, or the like may be used to form conductive layer 170. A dielectric layer 180 is formed overlying conductive layer 170. In at least one embodiment, dielectric layer 180 is a layer of deposited silicon nitride approximately 500 angstroms thick. A dielectric layer 190 is formed overlying dielectric layer 180. In at least one embodiment, dielectric layer 190 is a layer of silicon dioxide deposited to approximately 3000 angstroms thick. Thus, in at least one embodiment, conductive layer 170 is isolated from underlying and overlying materials by a dielectric stack comprising silicon dioxide and silicon nitride.

A masking layer 200 is formed overlying dielectric layer 190. In at least one embodiment, masking layer 200 is photoresist that is patterned to be removed in the area corresponding to surface 140 of trench 80 thereby exposing materials in this region for removal. Dielectric layer 190, dielectric layer 180, conductive layer 170, dielectric layer 160, and dielectric layer 150 are removed exposing surface 140 of trench 80. As illustrated, the masking and material removal process is done in a manner that leaves dielectric layer 150, dielectric layer 160, conductive layer 170, dielectric layer 180, and dielectric layer 190 intact along sidewall surface 100 of trench 80. Although it will be discussed in more detail hereinbelow, conductive layer 170 acts as a faraday shield to reduce gate to drain capacitance of the device. The faraday shield of the transistor terminates at a corner of trench 80. In at least one embodiment, the potential applied to conductive layer 170 depletes charge near sidewall surface 100 to increase voltage breakdown.

Figure 6:
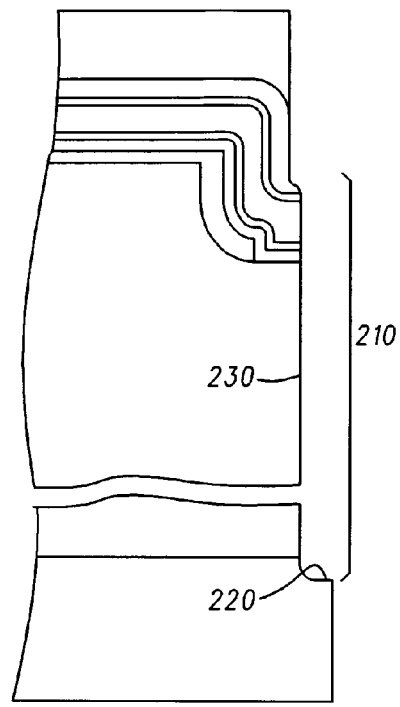
Figure 7:
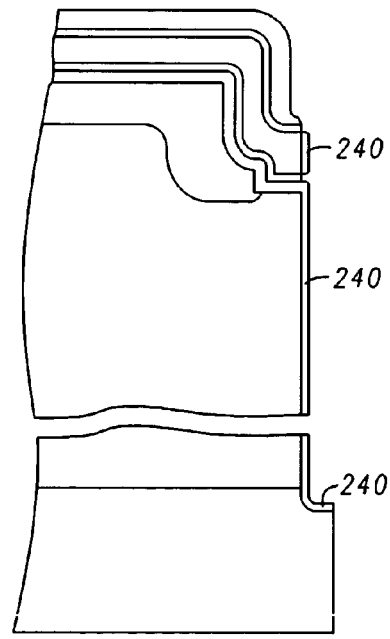

Referring to FIG. 6, a trench 210 is formed. Forming trench 210 may be a further enhancement to the transistor. Trench 210 is formed underlying trench 80, thus does not increase the size of the transistor. In subsequent processes that will be discussed in more detail hereinbelow, trench 210 provides edge termination for field lines allowing near planar breakdown to occur in n-type layer 20. Achieving planar breakdown reduces or minimizes the on-resistance of the transistor. In at least one embodiment, trench 210 is formed through n-type layer 20 into substrate 10. Trench 210 has a surface 220 and a sidewall surface 230. Surface 220 is a surface in substrate 10.

The process of forming trench 210 could be used to replace the etching process referred to in FIG. 4 if forming trench 210 sufficiently removes dopant that was implanted underlying trench 80. Conversely, the etching process referred to in FIG. 4 could be retained in the processing of the transistor to ensure charge underlying trench 80 is removed near the corner of trench 80.

Trench 210 creates a physical separation of n-type layer 20 on either side of trench 210. Trench 210 forms a physical boundary of a drain region of the transistor. In at least one embodiment, trench 210 is used to physically isolate a region of n-type layer 20. In the case of a single transistor structure, the transistor would have a predetermined drain region. Trench 210 is formed to bound or enclose the predetermined drain region of the single transistor. Thus, n-type layer 20 within the boundary created by trench 210 corresponds to the drain of the single transistor. The n-type layer 20 outside of the boundary created by trench 210 is physically isolated from n-type layer 20 within trench 210 but is electrically coupled through substrate 10. It should be noted that electrically isolated regions could also be formed using this methodology. Similarly, if a transistor comprises more than one transistor cell coupled in parallel, trench 210 is formed to bound or enclose a predetermined drain region of a single transistor cell or a predetermined drain region of a cluster of transistor cells. Thus, the single transistor cell or predetermined drain region of a cluster of transistor cells is physically isolated from an area outside the boundary. In each case where a drain region is bounded by trench 210, trench 210 is associated with edge termination of the device and achieving planar breakdown Referring to FIG. 7, a dielectric layer 240 is formed in accordance with one or more embodiments. In at least one embodiment, dielectric layer 240 is thermally grown silicon dioxide and forms on surface 220 and sidewall surface 230 of trench 210 approximately 2000 angstroms thick. Alternatively, a combination of thermally grown silicon dioxide and deposited silicon dioxide could be use to form dielectric layer 240 to reduce the thermal budget of the process flow. A portion of conductive layer 170 is also exposed in previous processes. In the at least one embodiment, where conductive layer 170 is polysilicon, the exposed portion of conductive layer 170 is converted to silicon dioxide. Dielectric layer 240 provides edge termination for the field lines to achieve planar breakdown within n-type layer 20.

Figure 8:
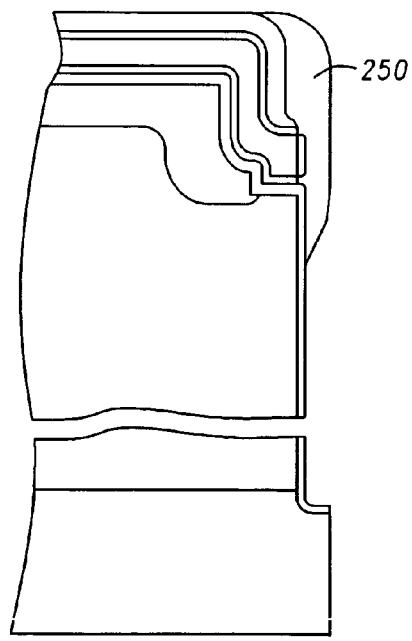

Referring to FIG. 8, a dielectric layer 250 is formed overlying the die in accordance with one or more embodiments. In at least one embodiment, dielectric layer 250 is phosphosilicate glass (PSG) deposited approximately 9000 angstroms thick. In trench 210, dielectric layer 250 overlies surface 220 and sidewall surface 230. The phosphosilicate glass will deposit at a higher rate near an opening or upper portion of trench 210 than along the sidewall surface 230 or surface 220 near a bottom of trench 210. The higher deposition rate will pinch off the opening at the upper portion of trench 210. In at least one embodiment, the opening of trench 210 is pinched closed or has a small opening near the upper portion of trench 210 by the deposited phosphosilicate glass. An air gap will exist in trench 210 below the pinched opening. The air gap in trench 210 reduces stress at the interface along sidewall surface 230. In a subsequent thermal process the phosphosilicate glass will reflow sealing trench 210.

In at least one embodiment, trench 210 may be filled with one or more materials, for example polysilicon. The material rates of expansion over temperature may be taken into account to reduce or minimize stress should trench 210 be filled with one or more materials. Stress build up due to different material coefficient of temperature expansion may result in dislocation defects that increase device leakage or catastrophic failure of the transistor. The pinching effect and the air gap will be shown in subsequent figures in more detail herein below.

Figure 9:
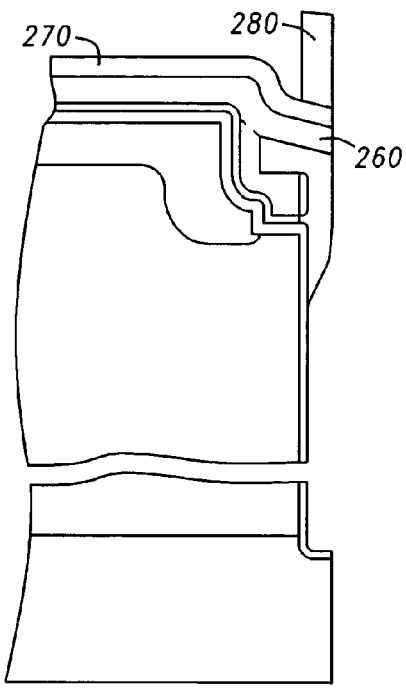

Referring to FIG. 9, a second faraday shield is formed overlying trench 80 in accordance with one or more embodiments. In at least one embodiment, the second faraday shield is coupled to the first faraday shield. The second faraday shield reduces gate to drain capacitance of the device. Furthermore, the second faraday shield is spaced to reduce or minimize the input and output capacitance of the transistor by its spacing relationship to n-type layer 20 and a gate/gate interconnect (not shown). In at least one embodiment, photoresist is deposited overlying the die. A masking process patterns the photoresist such that an area overlying trench 80 is protected. In at least one embodiment, dielectric layer 250 and dielectric layer 190 is removed in unprotected areas. The photoresist overlying trench 80 is then removed.

A dielectric layer is deposited overlying the die. In at least one embodiment, the dielectric layer is a deposited silicon dioxide layer that is formed approximately 7000 angstroms thick. A silicon dioxide etch is then performed exposing dielectric layer 180. In at least one embodiment, exposed dielectric layer 180 is etched exposing conductive layer 170. In at least one embodiment, conductive layer 170 is etched such that a horizontal portion of conductive layer 170 is removed but leaves a vertical portion of conductive layer 170 remaining that corresponds to trench 80. A conductive layer 260 is formed overlying the die. In at least one embodiment, conductive layer 260 is deposited polysilicon approximately 1250 angstroms thick. Other lower resistance conductive materials such as refractory metal silicides or metal could also be used. Conductive layer 260 couples to remaining conductive layer 170 and is heretofore described as conductive layer 260 or conductive layer 170.

A dielectric stack is then formed overlying conductive layer 260. A dielectric layer 270 is formed overlying conductive layer 260. In at least one embodiment, dielectric layer 270 is a silicon nitride layer deposited approximately 1500 angstroms thick. A dielectric layer 280 is formed overlying the die. In at least one embodiment, dielectric layer 280 is a silicon dioxide layer deposited approximately 7000 angstroms thick. Photoresist is applied overlying dielectric layer 280 and patterned with a masking process. Photoresist protects an area overlying trench 80. Dielectric layer 280 is removed in all areas other than the areas that were masked with photoresist. The remaining photoresist is then removed.

Figure 10:
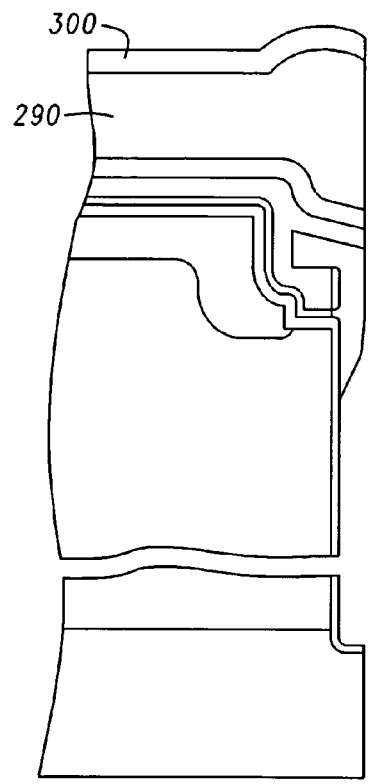

Referring to FIG. 10, a dielectric stack is formed in accordance with one or more embodiments. A dielectric layer 290 is formed over the die. In at least one embodiment, dielectric layer 290 is deposited silicon dioxide approximately 7000 angstroms thick. A dielectric layer 300 is formed overlying dielectric layer 290. In at least one embodiment, dielectric layer 300 is deposited silicon nitride approximately 2000 angstroms thick.

Figure 11:
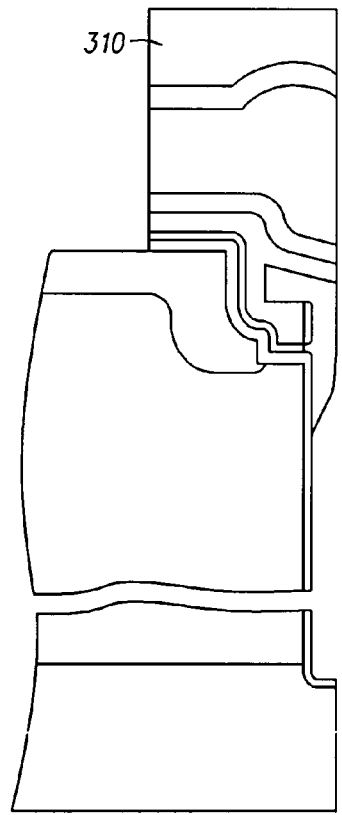

Referring to FIG. 11, a pedestal region of the transistor is formed by removing material in an area corresponding to a channel region and source region of the transistor in accordance with one or more embodiments. A photoresist 310 is applied overlying the die and patterned. The photoresist 310 is patterned to define a pedestal region of the transistor. Areas not having photoresist correspond to the source and channel region of the transistor. The following layers are removed in the areas not protected by photoresist 310: dielectric layer 300, dielectric layer 290, dielectric layer 270, conductive layer 260, and dielectric layer 160. The remaining photoresist 310 is then removed. The pedestal region of the transistor corresponds to the remaining dielectric stacks and the faraday shield structure having a vertical and horizontal component in proximity to the source and channel region of the transistor.

Figure 12:
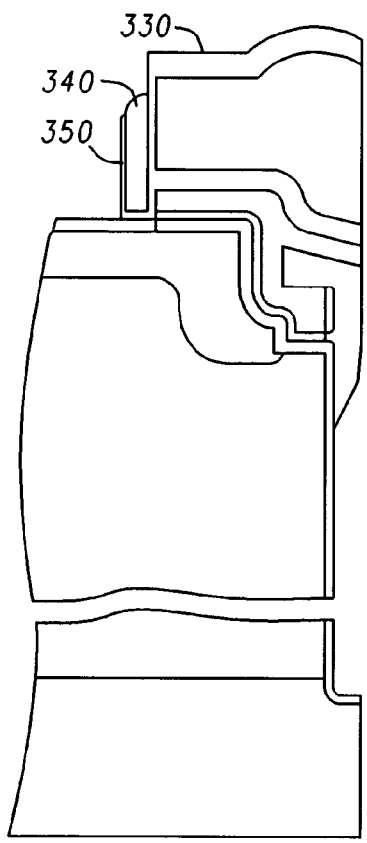

Referring to FIG. 12, a vertical dielectric stack is formed adjacent to the pedestal region of the transistor. The vertical dielectric stack electrically decouples a gate of the transistor from conductive layer 260. The gate is not shown but is formed in subsequent processes. A dielectric layer 330 is formed overlying the die. In at least one embodiment, dielectric layer 330 is a deposited silicon nitride approximately 500 angstroms thick. Dielectric layer 330 overlies dielectric layer 300 which in the embodiment also comprises silicon nitride. Dielectric layer 330 forms a 500 angstrom vertical layer adjacent to the pedestal region.

A dielectric layer 340 is formed overlying the die. In at least one embodiment, dielectric layer 340 is a deposited silicon dioxide approximately 1000 angstroms thick. In at least one embodiment, an anisotropic etch removes dielectric layer 340 on the horizontal surfaces but a vertical portion of dielectric layer 340 remains adjacent to dielectric layer 330 and the pedestal stack.

A dielectric layer 350 is formed overlying the die. In at least one embodiment, dielectric layer 350 is deposited silicon nitride approximately 250 angstroms thick. In at least one embodiment, an anisotropic etch removes dielectric layer 350 on the horizontal surface but a vertical portion of dielectric layer 350 remains adjacent to dielectric layer 340. In at least one embodiment, a portion of dielectric layer 340 is exposed and not covered by dielectric layer 350. Thus, the vertical dielectric stack comprising dielectric layers 330, 340, and/or 350 is formed adjacent to the pedestal region of the transistor. The vertical dielectric stack is part of the pedestal.

Figure 13:
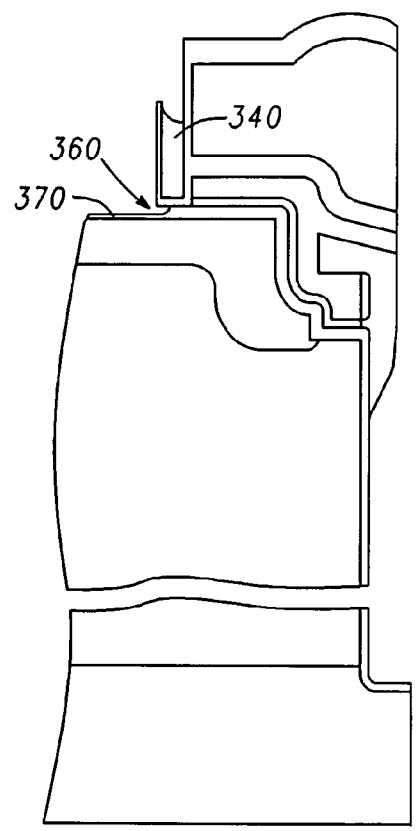

Referring to FIG. 13, an undercut is performed on the vertical dielectric stack shown in and described with respect to FIG. 12 that increases the breakdown voltage of the transistor. In at least one embodiment, an isotropic etch is performed that removes exposed dielectric layer 150 and a portion of dielectric layer 340. In at least one embodiment, removal of dielectric layer 150 undercuts the vertical stack comprising dielectric layers 330, 340, and 350 forming an undercut region 360. In at least one embodiment, removal of dielectric layer 150 is by isotropic etching. The isotropic etching also removes a portion but not all of dielectric layer 340. In at least one embodiment, the undercut has a curvature of radius that reduces the field strength from the gate to channel/drain interface of the transistor. Conversely, an abrupt or squared off gate overlying the channel/drain interface would be subject to extremely high fields across a gate oxide which is detrimental or catastrophic to the device. A dielectric layer 370 is formed on major surface 50. In at least one embodiment, dielectric layer 370 is a thermally grown gate oxide formed 200 angstroms thick. As is understood by one skilled in the art, the thickness and type of dielectric material used to electrically isolate a gate and channel region of a field effect transistor may be a function of the device characteristics designed for a specific application and may be selected accordingly.

Figure 14:
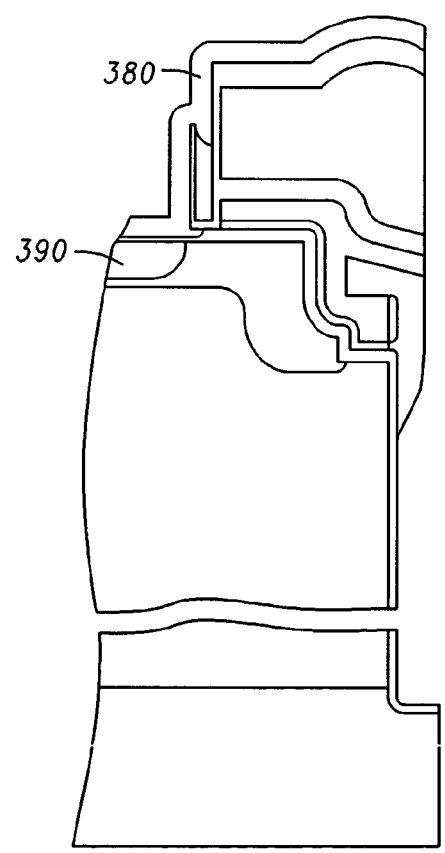

Referring to FIG. 14, a channel region of the transistor is formed in accordance with one or more embodiments. A conductive layer 380 is formed overlying the die. Conductive layer 380 forms a gate and gate interconnect of the transistor in a single process. Conductive layer 380 may be formed in one or more depositions. In at least one embodiment, the conductive layer 380 will be formed in two deposition processes to allow finer control of where the channel region is placed. In at least one embodiment, conductive layer 380 comprises a first deposition of a phosphorous doped polysilicon approximately 1200 angstroms thick.

A tub region 390 of the transistor is formed by implantation. In at least one embodiment, boron is implanted in two processes having a dose of $1.5 \times 10^{13}$ atoms/cm$^2$ at energies of 50 keV and 80 keV. The boron dopant dopes n-type layer 20 in an area corresponding to the source and channel region of the transistor. In at least one embodiment, tub region 390 is a p-type region in n-type layer 20 that is formed having an approximate depth of 0.25 microns. As is understood by one skilled in the art, tub region 390 may out-diffuse due to subsequent wafer process processes and may be taken into account accordingly.

Figure 15:
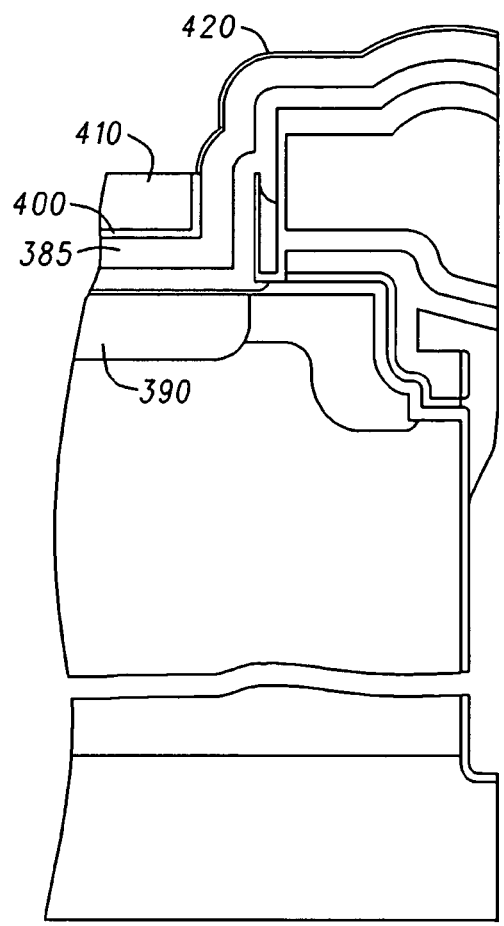

Referring to FIG. 15, an additional deposition is performed adding material to conductive layer 380 in accordance with one or more embodiments. The added material is a conductive layer 385. In at least one embodiment, conductive layer 385 is a phosphorous doped polysilicon overlying the die approximately 1800 angstroms thick. Thus, conductive layers 380 and 385 combine to be approximately 3000 angstroms thick total. As mentioned previously, the vertical portion of conductive layers 380 and 385 adjacent to the vertical dielectric stack forms the gate of the transistor. Underlying the vertical portion of conductive layers 380 and 385 is dielectric layer 370 (gate oxide), and tub region 390. The portion of tub region 390 underlying the vertical portion of conductive layers 380 and 385 corresponds to the channel region of the transistor. Thus, the thickness of the vertical portion of conductive layers 380 and 385 may define a channel length of the device which in this example is approximately 3000 angstroms or 0.3 microns.

In at least one embodiment, the gate of the transistor corresponds to a vertical portion of conductive layers 380 and 385 adjacent to the vertical dielectric stack and in proximity to the pedestal region. The horizontal portion of conductive layers 380 and 385 overlying the vertical dielectric stack and the pedestal region corresponds to gate interconnect to other circuitry or gate interconnect to other transistor cells. In at least one embodiment, the thickness of conductive layers 380 and 385 corresponds to the channel length of the transistor. For example, in the at least one embodiment, conductive layers 380 and 385 are formed from approximately 3000 angstroms of polysilicon. Thus, the channel length of the example transistor is approximately 3000 angstroms or 0.3 microns and the channel length is non-lithographically defined. In the example, a short channel length device may be manufactured in a wafer fabrication facility having lithographic capabilities greater than the channel length, for example forming a device having 0.3 microns channel length in a wafer fab having 0.6 micron lithographic capability, although the scope of the claimed subject matter is not limited in these respects.

A dielectric layer 400 is formed overlying the die. In at least one embodiment, dielectric layer 400 is deposited silicon nitride approximately 500 angstroms thick. A photoresist 410 is applied overlying the die. In at least one embodiment, photoresist 410 covers the die and fills the opening corresponding to the source and channel region of the transistor. The photoresist 410 is then etched exposing dielectric layer 400 overlying the pedestal region of the transistor. In at least one embodiment, the photoresist 410 is removed in a manner where a vertical portion of dielectric layer 400 adjacent to the vertical gate is covered by photoresist 410 and a horizontal portion of dielectric layer 400 is covered by photoresist in proximity to major surface 50 of n-type layer 20. As shown, the photoresist 410 fills the opening corresponding to the source region and channel region of the transistor to a level approximately the height of the pedestal region. In at least one embodiment, exposed areas of dielectric layer 400 are removed. This exposes a portion of conductive layer 385 that overlies the pedestal region of the transistor. In at least one embodiment, the remaining photoresist layer 410 is then removed. A dielectric layer 420 is then formed. In at least one embodiment, dielectric layer 420 is a thermally grown silicon dioxide layer approximately 150 angstroms thick formed on the exposed portion of conductive layer 385. It should be noted that tub region 390 out diffuses during the thermal process of forming dielectric layer 420.

Figure 16:
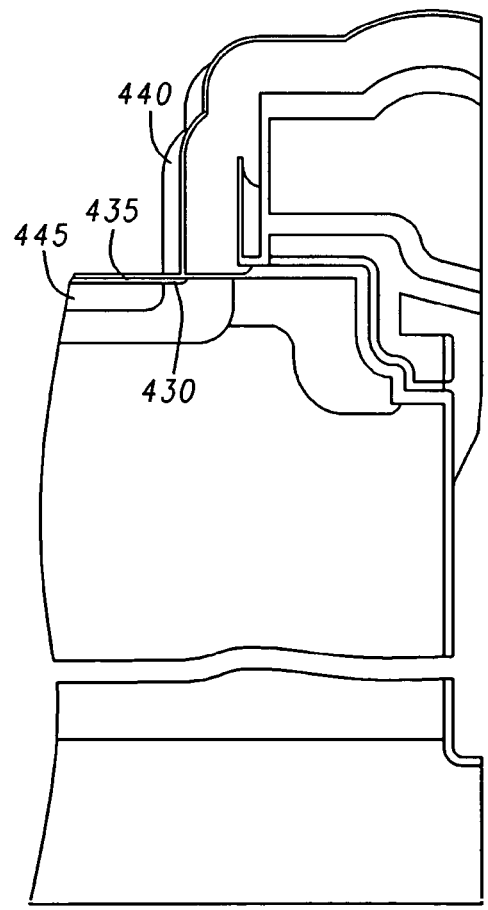

Referring to FIG. 16, the source of the transistor is formed in accordance with one or more embodiments. Since conductive layers 380 and 385 form a single layer of conductive material they will be referred to hereinafter as either conductive layer 380 or conductive layer 385 but both are present unless otherwise specified. Dielectric layer 400 is removed by etching exposed conductive layer 380. In at least one embodiment, an anisotropic etch removes the horizontal portion of conductive layer 380 overlying the source region of the transistor but leaves the vertical portion of conductive layer 380 corresponding to the transistor gate intact. In at least one embodiment, a thermal oxidation of exposed conductive layer 380 forms a 150 angstrom layer of silicon dioxide. In at least one embodiment, boron is implanted having a dose of $1.5 \times 10^{13}$ atoms/cm$^2$ at 60 keV to increase the doping of tub region 390.

A layer 430 is formed in tub region 390. In at least one embodiment, layer 430 is implanted phosphorous at a dose of $1 \times 10^{15}$ atoms/cm$^2$ at 45 keV. Layer 430 resides near major surface 50 and is a lightly doped source region of the transistor. Layer 430 is self aligned with a source side edge of the vertical portion of conductive layer 380 that forms the gate of the transistor.

A dielectric layer 440 is formed overlying the die. In at least one embodiment, dielectric layer 440 is deposited silicon nitride approximately 1000 angstroms thick. In at least one embodiment, dielectric layer 440 is anisotropically etched removing horizontal portions of dielectric layer 440 overlying the source and pedestal regions of the transistor. A vertical portion of dielectric layer 440 remains adjacent to the vertical portion of conductive layer 380. In at least one embodiment, a second phosphorous implant forms a layer 435 which further dopes tub region 390 and is applied having a dose of $2 \times 10^{15}$ atoms/cm$^2$ at 35 keV.

A parasitic bipolar transistor is an artifact of the device structure. The collector, base, and emitter of the parasitic bipolar transistor is respectively n-type layer 20, tub region 390, and layer 430. The bipolar transistor gain is greatly reduced by implanting a heavily doped p-type region 445 underlying layer 430 within tub region 390. In at least one embodiment, boron is implanted at a concentration of $3 \times 10^{14}$ atoms/cm$^2$ at 45 keV. Furthermore, the base-emitter junction (tub region 390-layer 430) will be shorted together by the source metallization in subsequent processes.

Figure 17:
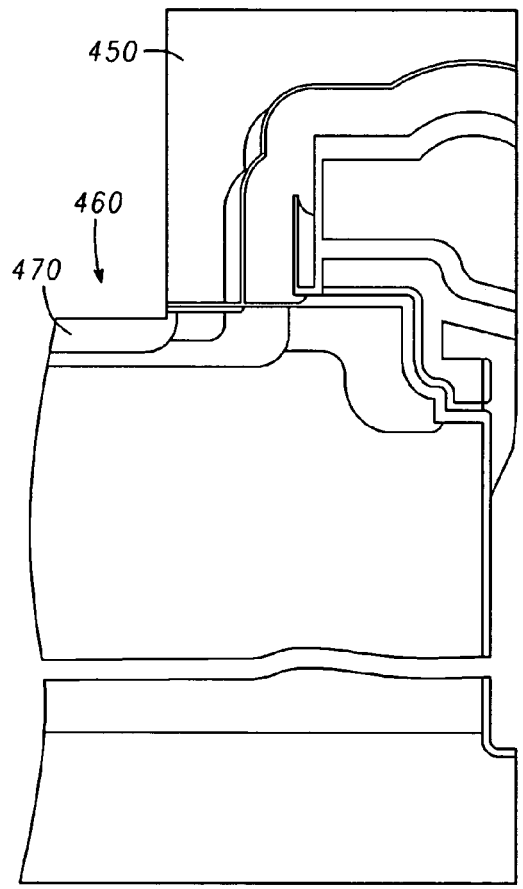

Referring to FIG. 17, a photoresist 450 is patterned to form an opening to form a contact opening for the source region of the transistor in accordance with one or more embodiments. In at least one embodiment, photoresist 450 overlies the pedestal region of the transistor, the vertical gate of the transistor, and a portion of tub region 390. Dielectric layer 370 is removed in the area having no photoresist exposing layer 430. In at least one embodiment, a trench 460 is etched to a depth of approximately 2000 angstroms to remove layer 430 in this area. In at least one embodiment, an implant using bf$^2$ (boron with two fluorine atoms) at a concentration of $1.5 \times 10^{15}$ atoms/cm$^2$ at 50 keV is used to form layer 470 which facilitates contact to tub region 390 when a source metal contact is formed.

Figure 18:
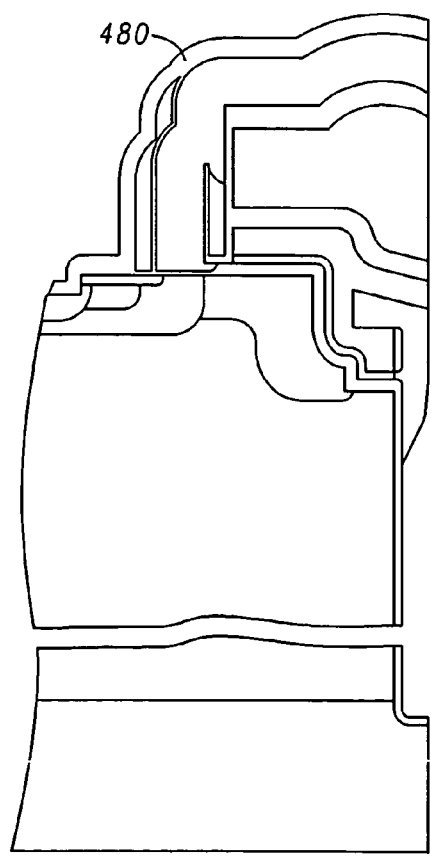

Referring to FIG. 18, the remaining photoresist is then removed in accordance with one or more embodiments. A dielectric layer 480 is formed overlying the die. In at least one embodiment, dielectric layer 480 is deposited silicon dioxide approximately 1000 angstroms thick.

A rapid thermal anneal is performed to activate the phosphorous and boron dopants. In at least one embodiment, the rapid thermal anneal is performed at 1040 degree Celsius for approximately 35 seconds. In at least one embodiment, an anistropic etch removes exposed silicon dioxide overlying the gate interconnect and the source region of the transistor. In at least one embodiment, titanium is deposited approximately 700 angstroms thick over the die. In at least one embodiment, a rapid thermal anneal at about 650 degrees Celsius forms a titanium silicide to reduce resistance. In at least one embodiment, the unconverted titanium is then etched from the die.

Figure 19:
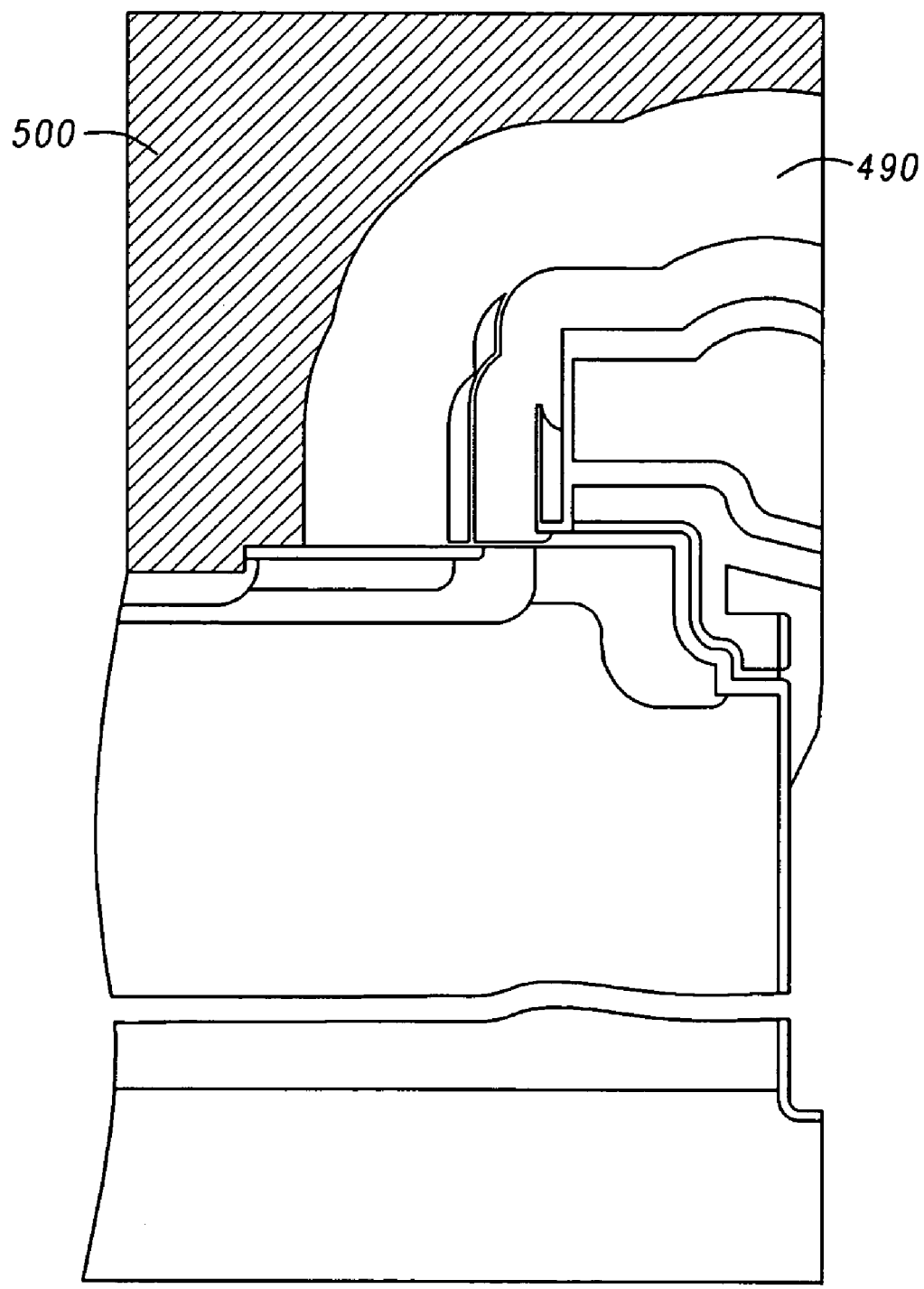

Referring to FIG. 19, a dielectric layer 490 is formed overlying the die in accordance with one or more embodiments. Dielectric layer 490 isolates a source interconnect from a gate interconnect of the transistor. Dielectric layer 490 is formed to minimize gate to source capacitance. In at least one embodiment, dielectric layer 490 is deposited silicon dioxide approximately 1 micron thick.

Photoresist is applied and patterned overlying the die. In at least one embodiment, photoresist is removed in an area corresponding to the layer 470 and a portion of layer 430. In at least one embodiment, exposed areas of dielectric layer 490 are etched to expose the source contact area of the transistor. The remaining photoresist is then removed. A conductive layer 500 is then deposited overlying the die. In at least one embodiment, conductive layer 500 is a metal such as aluminum-silicon-copper for low resistance and is deposited approximately 1.4 microns thick. Conductive layer 500 couples layer 430, layer 490, and tub region 390 together. In at least one embodiment, conductive layer 500 connects the base-emitter junction in common thereby greatly increasing the ruggedness of the device by mitigating or preventing turn-on of the parasitic bipolar transistor that is a common failure mechanism for transistors.

Although not shown, the patterning of the photoresist may include a contact opening to conductive layer 380 that corresponds to the gate interconnect of the transistor. The gate interconnect and the source interconnect would have to be separated from one another in a subsequent photoresist patterning and etch process.

It should be noted that a transistor designed by one skilled in the art may be linked to a specific set of specifications. For example, a transistor designed for 1500 volt operation may not be optimal for a 3 volt application. Moreover, one skilled in the art is often constrained by the materials and wafer processing tools available in the manufacturing facility. The above described wafer process flow is an embodiment of a device having a breakdown voltage in a range of 100 to 150 volts and a 0.3 micron channel length. Substantial variation may occur in material choice such as dielectric layers and conductive layers, or combinations thereof. For example, dielectric stacks and conductive layer stacks are used in one or more embodiments. A single dielectric layer or a single conductive layer also may be contemplated by the claimed subject matter. Furthermore, wafer processing times, temperatures, energies, and so on, are typically unique to a specific design. It should be understood that the claimed subject matter is not limited to the disclosed embodiments. Thus, the wafer process flow and/or device structure disclosed herein is merely in nature and it is expected that one skilled in the art may produce variations that do not depart from the spirit of the claimed subject matter. Moreover, these variations are intended to be within the scope of the claimed subject matter.

Figure 20:
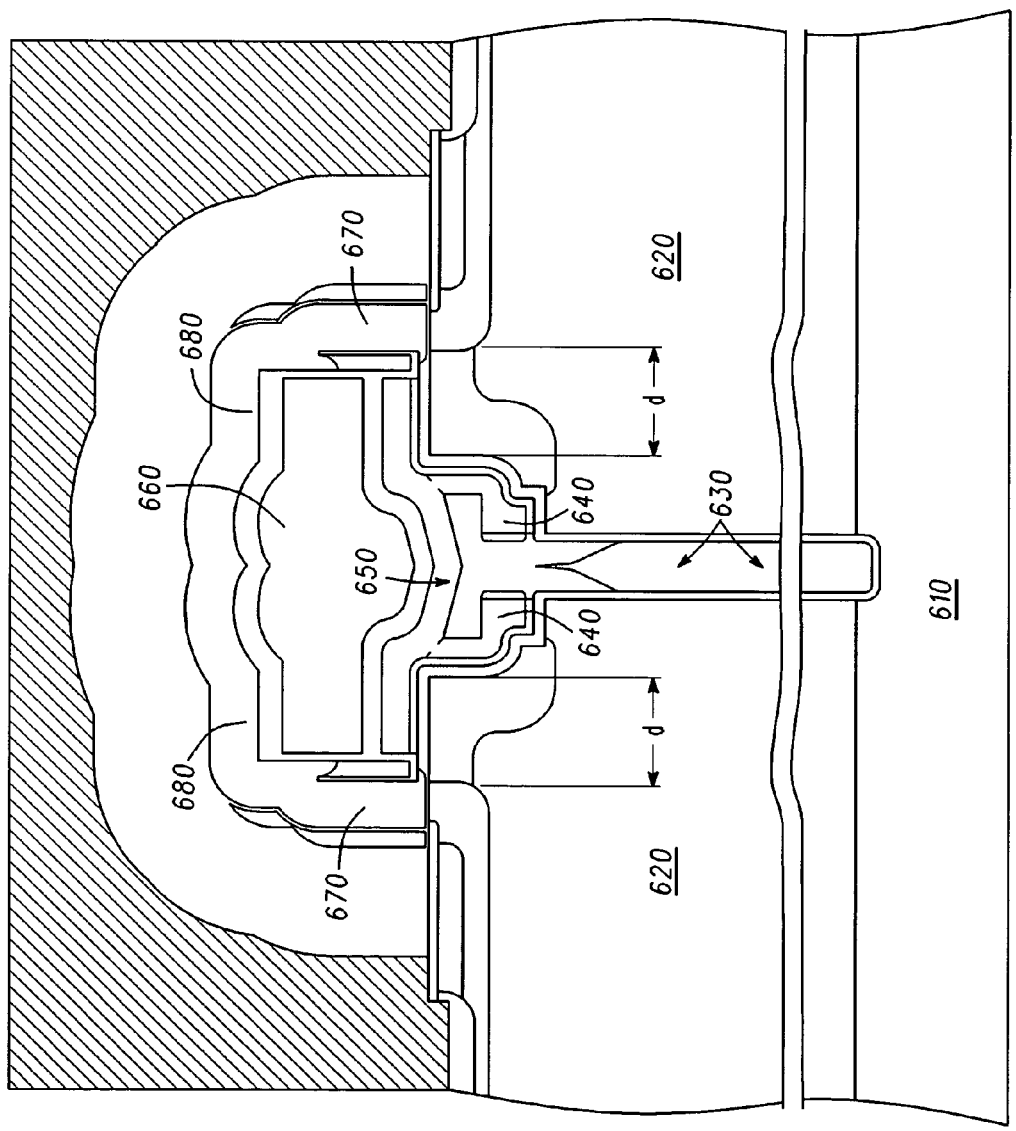
FIG. 20 is an exploded cross-sectional view of a portion of a transistor in accordance with one or more embodiments.

FIG. 20 is a cross-sectional view of a partial transistor 600 in accordance with one or more embodiments. Partial transistor 600 is herein called transistor 600. In at least one embodiment, a drain region 620 is formed overlying a substrate 610. Substrate 610 and drain region 620 are of the same conductivity type. A dielectric region 630 bounds drain region 620 in a lateral direction. In at least one embodiment, dielectric region 630 extends through drain region 620 and into substrate 610.

A vertical shield 640 and a horizontal shield 650 are formed within dielectric region 620. In at least one embodiment, vertical shield 640 extends from a major surface of the die in proximity to drain region 620. Horizontal shield 650 extends horizontally within dielectric layer 620. In at least one embodiment, vertical shield 640 and horizontal shield 650 are coupled together to be at the same voltage potential during operation of transistor 600.

A pedestal region 660 overlies dielectric region 630 and a portion of drain region 620. A vertical gate 670 of transistor 600 is adjacent to pedestal region 660. A gate interconnect 680 overlies pedestal region 660. In at least one embodiment and described hereinabove, vertical gate 670 and gate interconnect 680 are formed in a single process of the same material. Vertical gate 670 and gate interconnect 680 are identified separately merely to distinguish the location difference of the common material and to facilitate the discussion herein below.

A portion of a tub region 690 underlies vertical gate 670. A source region 700 overlies tub region 690. A channel region 710 of transistor 600 is approximately a distance between a source region 700/tub region 690 interface and a drain region 620/tub region 690 interface. Channel region 710 comprises the portion of tub region 690 underlying vertical gate 670. A distance "d" is the distance between the drain region 620/tub region 690 interface and dielectric region 630.

In at least one embodiment, transistor 600 is an enhancement transistor. A voltage applied to vertical gate 670 greater than a threshold voltage of transistor 600 inverts a surface of channel region 710 to the same conductivity type as drain region 620 and source region 700. Thus, transistor 600 may be capable of conducting a current. The amount of current conducted by the transistor 600 is a function of many different parameters of which some are the applied voltage to vertical gate 670, a differential voltage from drain region 620 to source region 700, transistor 600 gate length and/or transistor 600 gate width.

In at least one embodiment, vertical shield 640 and/or horizontal shield 650 act as a faraday shield and may be coupled to source region 700. Alternately, vertical shield 640 and/or horizontal shield 650 may be biased to a predetermined voltage. Vertical shield 640 and horizontal shield 650 is placed between vertical gate 670 and/or gate interconnect 680 and drain region 620 thereby reducing the gate to drain capacitance of the device substantially. Reducing gate to drain capacity increases the frequency performance and/or device efficiency of transistor 600. It should be noted that vertical shield 640 and dielectric region 630 extend below a bottom of tub region 690. This relationship will be discussed in more detail herein below.

Figure 21:
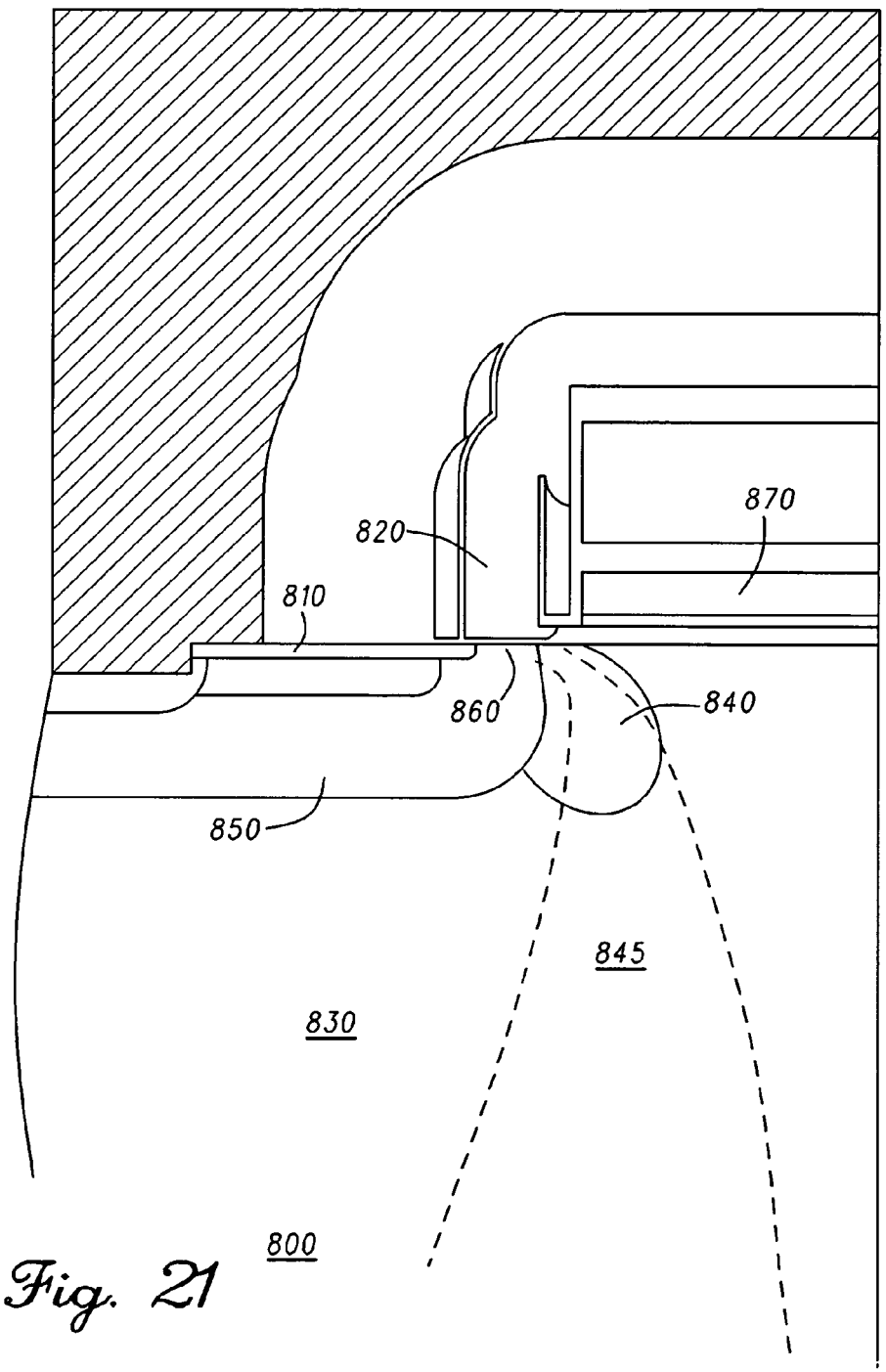
FIGS. 21-22 are exploded cross-sectional views of a portion of a transistor without a trench showing current flow and equal potential field lines in accordance with one or more embodiments.

Referring to FIG. 21, current flow from a transistor 800 in accordance with one or more embodiments will be discussed. Transistor 800 comprises a source region 810, a gate 820, and a drain region 830. A tub region 850 underlies source region 810 and gate 820. A channel region 860 underlies gate 820 and comprises a portion of tub region 850 between source region 810 and drain region 830. A faraday shield 870 is located between gate 820 and drain region 830 to reduce gate to drain capacitance. In the illustration, transistor 800 does not have a trench formed in drain region 830 as disclosed herein above.

For illustration purposes, transistor 800 may be an enhancement device. A voltage applied to gate 820 inverts a surface of channel region 860 forming a channel of the same conductivity type as drain region 830 and source region 810. The channel couples drain region 830 to source region 810. In normal operation, there is a voltage differential from drain region 830 to source region 810. In general, a transistor will have a breakdown voltage specification. Transistor 800 will function correctly if operated below the breakdown voltage specification. Typically, a safe operating area of a transistor is also specified that discloses power dissipation constraints on the device. Exceeding the safe operating area may result in catastrophic failure of the device.

A region 840 encloses a portion of drain region 830. Region 840 borders the channel/drain interface of transistor 800. The channel of enabled transistor 800 is formed in proximity to a surface of channel region 860. In general, the channel of a transistor is not a limiting factor in the maximum current of a device. In order to maximize, or nearly maximize, current density in the device without degrading other parameters such as frequency performance, voltage breakdown, and/or device efficiency, sufficient carriers may be available to conduct the current exiting the channel.

Current flow is illustrated in region 840 for transistor 800. The majority of the current flow occurs within the boundaries by dotted line region 845. The current density of transistor 800 is a maximum at the channel/drain interface. As illustrated the current spreads out with a subsequent reduction in current density as the current moves away from the channel/drain interface. A surface implant as described in FIG. 1 puts charge near the channel/drain interface increasing the current output of the transistor. The location of the dopant as well as the amount of dopant placed in region 840 will impact the voltage breakdown and the current density of the transistor.

Figure 22:
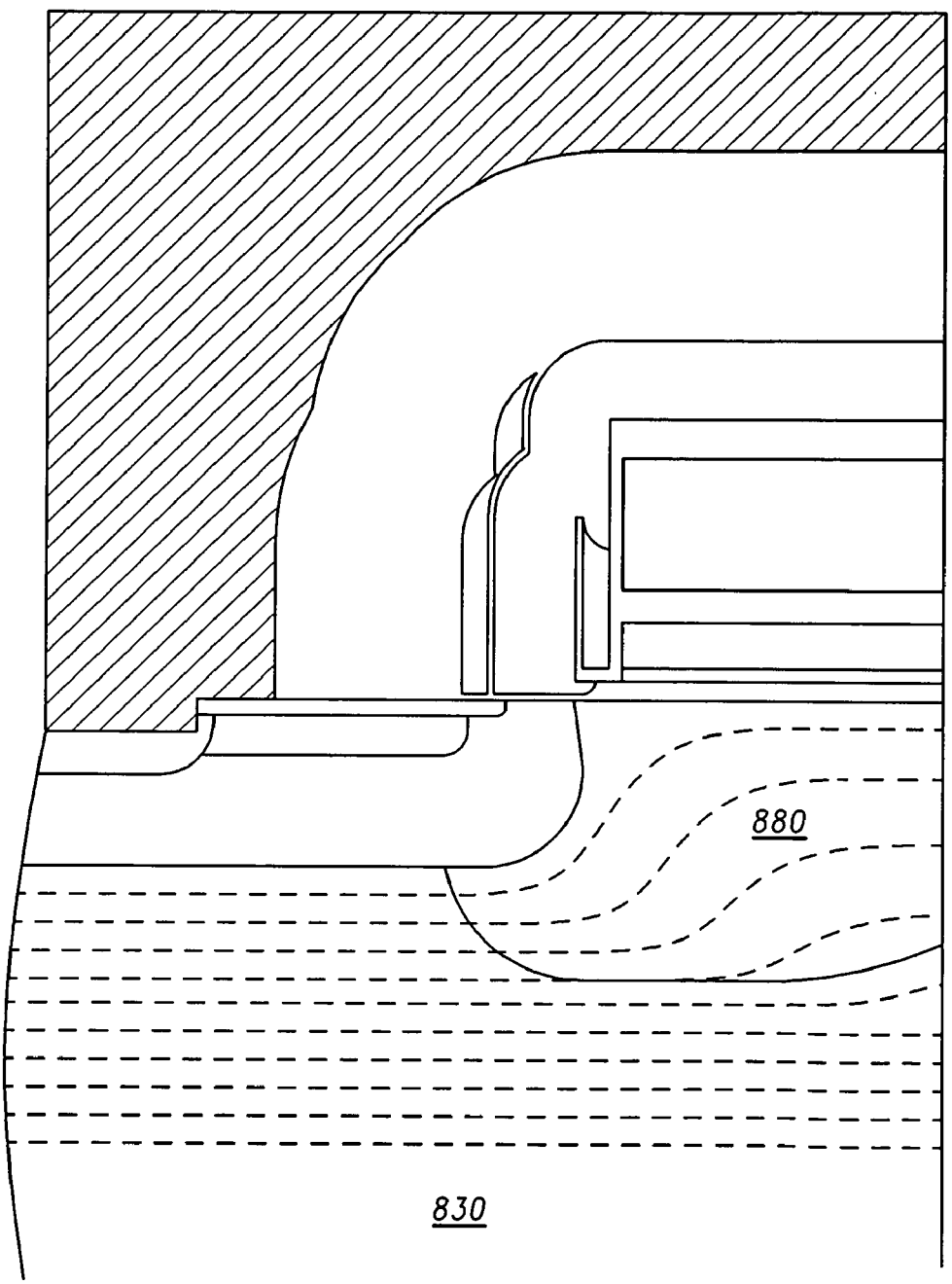

Referring to FIG. 22, equal potential field lines are illustrated in drain region 830 of the transistor as dashed lines in accordance with one or more embodiments. As shown, the field lines may become parallel and equally spaced to one another as you move vertically in drain region 830 away from a surface of the die. In general, to maximize or nearly maximize performance, the lowest or nearly lowest resistivity material should be used in drain region 830 that supports the voltage breakdown requirement of the device with the minimum or nearly minimum on-resistance.

Drain region 830 and tub region 850 form a p-n junction. The p-n junction is reverse biased under normal operating conditions of transistor 800. Curvature of the equal potential lines occurs near the channel/drain interface of transistor 800. In particular, equal-potential field lines have substantial curvature in a drain region 880. Drain region 880 is a portion of drain region 830 and is located near a corner of tub region 850. The curvature and bunching of the field lines in drain region 880 indicate a region of high field strength that will breakdown at a lower voltage when compared to a planar breakdown example. The curvature limited breakdown that occurs in transistor 800 would result in using a higher resistivity material or increasing the thickness of drain region 830 to meet a voltage breakdown requirement of transistor 800.

Figure 23:
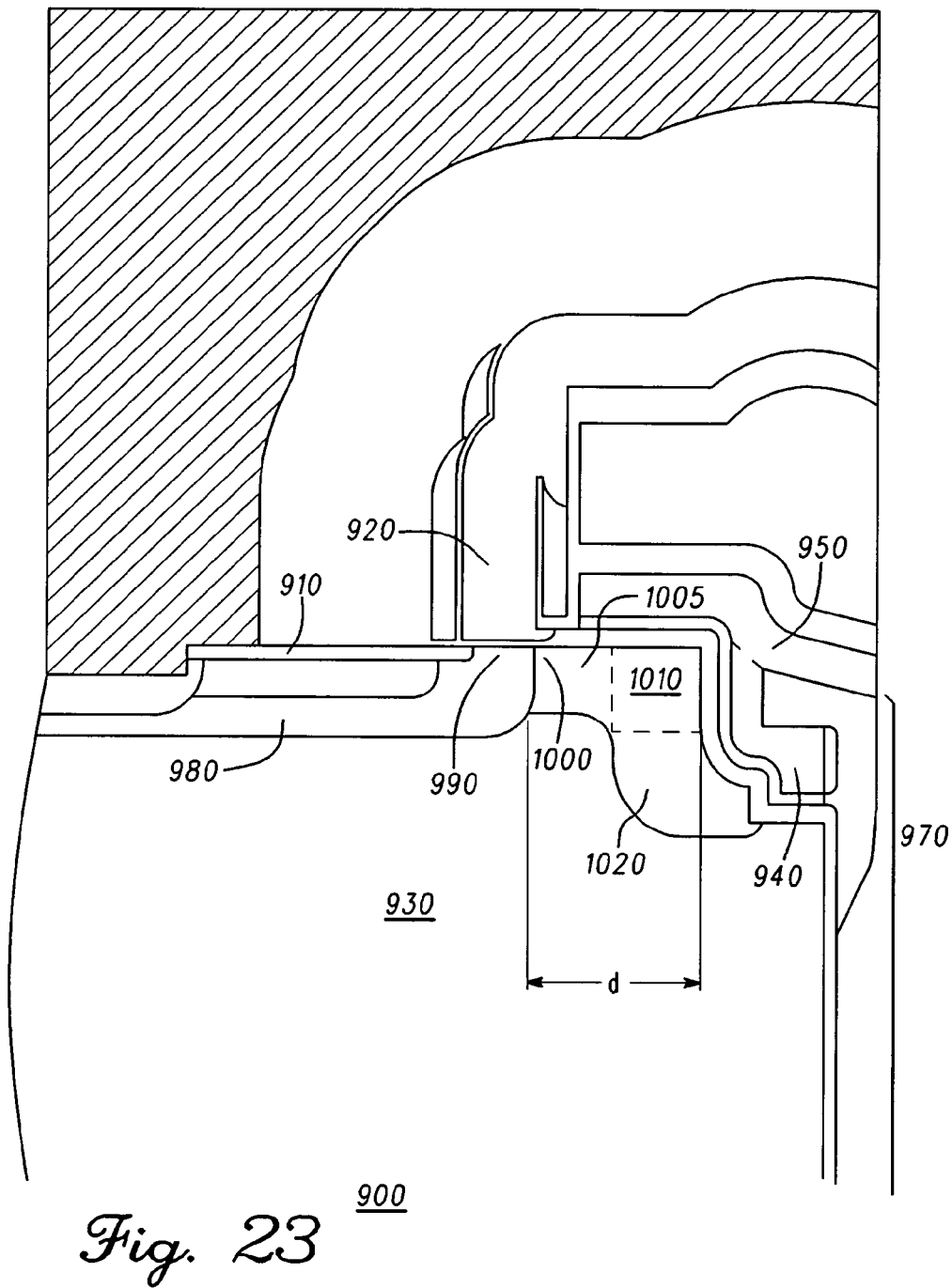
FIGS. 23-24 are exploded cross-sectional views of a portion of a transistor in accordance with one or more embodiments.

FIG. 23 is an exploded view of a transistor 900 illustrating doping levels after at least one thermal process to diffuse the dopant in a drain area 960 in accordance with one or more embodiments. Transistor 900 comprises a source region 910, a gate 920, a drain region 930, a vertical shield 940, a horizontal shield 950, and a trench 970. Drain region 930 may be an isolated region corresponding to only transistor 900 or it may be common to other transistors (not shown) to form a larger device. A portion of tub region 980 underlies source region 910. A channel region 990 is a portion of tub region 980 that is between source region 910 and drain region 930. The channel region 990 also underlies gate 920.

In the example shown, transistor 900 is a n-channel device, however it should be understood that a p-channel device could be formed similarly as described herein above. Source region 910 and drain region 930 is n-type while tub region 980 is p-type for the n-channel device. In at least one embodiment, source region 910 is shorted to tub region 980.

In at least one embodiment, transistor 900 is an enhancement device. A voltage applied to gate 920 greater than a threshold voltage of the device inverts a surface of channel region 990. The inverted channel couples drain region 930 to source 910 allowing current to flow from drain to source. In general, current from transistor 900 exits a channel/drain interface at or near a surface 1000 of drain region 930. Trench 970 is filled with one or more dielectric materials and includes vertical shield 940 and a portion of horizontal shield 950. Current flow in the lateral direction is constrained by trench 970. Trench 970 is spaced a distance d from the channel/drain interface as indicated in FIG. 23.

Transistor 900 has a predetermined breakdown voltage that is a part of the specification of the device. Design of drain region 930 is optimized to maximize, or nearly maximize, current density of transistor 900 and minimize, or nearly minimize, distance d. Maximizing the current density and minimizing distance d combine to reduce the area of transistor 900 which allows more die to be place on a wafer thereby lowering manufacturing costs. A related factor is the on-resistance of the device. In one or more embodiments, achieving planar breakdown in drain region 930 may result in the minimum thickness and minimum resistivity for drain region 930 resulting in the lowest, or nearly lowest, possible on-resistance.

It will be shown in the simulation of transistor 900 that it exhibits near planar breakdown in drain region 930. This will be shown graphically in subsequent figures herein below. Planar or near planar breakdown is achieved when the depth of trench 970 is greater than tub region 980. Extending trench 970 to a depth greater than tub region 980 moves the region where maximum curvature of the field occurs from tub region 980 to a region located along trench 970.

In at least one embodiment, trench 970 is formed to a depth about 3 times greater than tub region 980. Extending trench 970 into drain region 930 moves the area where the highest, or nearly highest, field strength occurs from a corner of tub region 980 to trench 970. In at least one embodiment, trench 970 has a layer of dielectric material adjacent to drain region 930. Thus, no p-n junction may exist along a sidewall or bottom surface of trench 970 where the high fields reside.

Vertical shield 940 runs parallel to the interface of trench 970 and drain region 930 and is terminated or cut off at the bottom of trench 970. The dielectric layer on the sidewall of trench 970 separates vertical shield 940 from drain region 930. The thickness of the dielectric material between vertical shield 940 and drain region 930 is selected such that it does not breakdown or produce tunneling under high field conditions associated with the operation of transistor 900. Vertical shield 940 acts as a faraday shield to reduce gate to drain capacitance. Near planar breakdown is achieved because transistor 900 does not avalanche in the area where field strength is highest. This will be shown graphically in subsequent figures herein below. Typically, trench 970 is formed greater than 2 times the depth of tub region 980 for high voltage devices. For example, devices having a voltage breakdown greater than 100 volts. The depth of trench 970 will vary depending on the application, current requirements of the device, and voltage breakdown requirements. In general, the voltage breakdown of a transistor will improve as the trench depth is increased greater than the depth of the tub region.

In at least one embodiment, dopant is provided in two processes to maximize current density of transistor 900 and improve the consistency of device performance and yield. In general, there must be sufficient charge to support the flow of current in any area of drain region 930. As shown previously, the current spreads out as the current moves away from the surface of the die in drain region 930. Typically, the resistivity of drain region 930 is selected under the condition where the current is substantially spread out and is selected to minimize transistor 900 on-resistance while meeting the voltage breakdown requirement as is well known by one skilled in the art. In general, the current is spread out in drain region 930 below trench 970.

Conversely, in drain region 960 of transistor 900 the current has not spread out and higher current densities need to be supported in this region. Peak current density occurs at the channel/drain interface near the surface of the die. The current density falls as the current spreads out laterally and vertically into drain region 960. Still, the current densities in drain region 960 are higher than in areas of drain region 930 at a depth lower than the bottom of trench 970 and as such there must be sufficient charge in all areas of drain region 960 to support the higher current densities. In at least one embodiment, a first implant provides dopant near surface 1000. The first implant near the drain/channel interface supports this region of peak current density.

In at least one embodiment, a second implant is placed in drain region 960 during the formation of trench 970. The second implant places charge to support the higher current densities as the current moves vertically through drain region 960. The second implant doping concentration is typically less than the doping concentration of the first implant. As described herein above in FIG. 3, alignment of the second implant to the formation of trench 970 consistently places the charge in drain region 960 for a single sided transistor, a transistor having multiple sides, or a transistor comprising multiple transistor cells having multiple sides. The second implant implants dopant approximately parallel with a sidewall of trench 970. Dopant beneath trench 970 is removed.

Transistor 900 may be subject to mask alignment tolerances. Transistor 900 would be subject to wide variations in device performance if only the first implant was used because of mask alignment tolerances. Mask misalignment results in a variation in the distance d from the channel/drain interface to trench 970. The variation in d would directly relate to a variation in the dopant placed in drain region 960 by the first implant. The amount of implanted dopant in drain region 960 relates to the current output of transistor 900. Thus, wide variations in device yield and performance would result. The second implant reduces the overall variation in dopant placed in drain region 960 because it may be accurately and consistently placed and is not subject to change due to mask misalignment. In at least one embodiment, a first implant 1005 supports the higher current densities near the channel/drain interface in close proximity to surface 1000 while the second implant supports the current as it spreads out in drain region 960.

In at least one embodiment, the first and second implants are distributed in drain region 960 during the formation of thermal oxide in trench 970. As mentioned herein above, the highest concentration of dopant is near surface 1000 to support current flow at the channel/drain interface where the current density is highest. A doped region 1010 comprises a combination of the first and second implants. The doping concentration in doped region 1010 decreases with distance from surface 1000. Finally, a doped region 1020 comprises mostly dopant from the second implant. In the example above, drain region 960 comprises doped regions 1005, 1010, and 1020. Although in the embodiments a pedestal transistor is formed, it should be understood that trench 970, drain region 930, and drain region 960 could be used to increase performance of other planar field effect transistors and bipolar transistors as would be understood by one skilled in the art.

Figure 24:
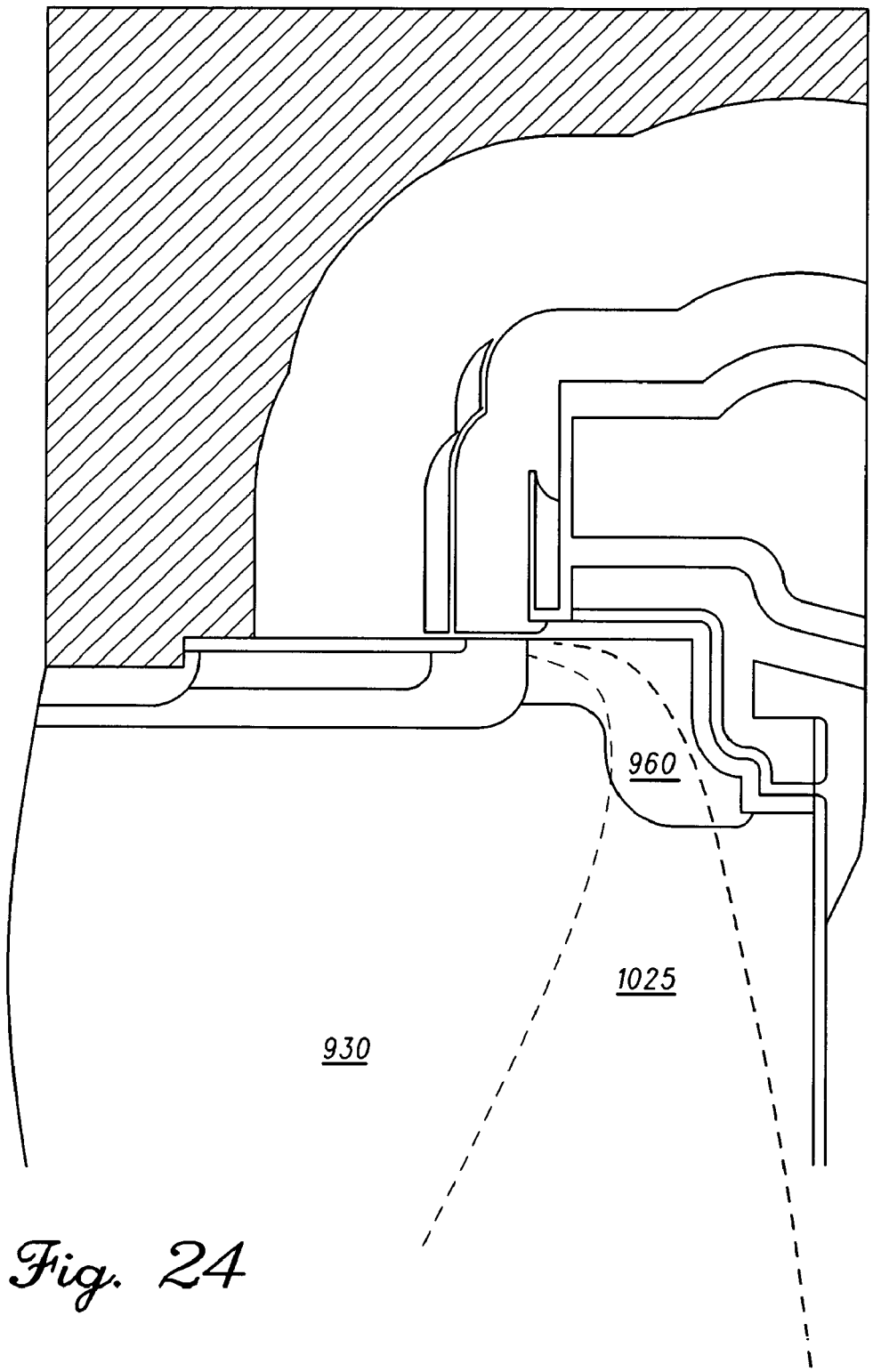

Referring to FIG. 24, the current flow in drain region 960 and 930 of transistor 900 is illustrated in accordance with one or more embodiments. The majority of the current of transistor 900 flows in drain regions 960 and 930 between dashed lines 1025. The peak current density occurs in drain region 960 near the channel/drain interface. The illustration shows a reduction of current density as the current spreads out and moves vertically in drain regions 960 and 930 as described herein above.

Figure 25:
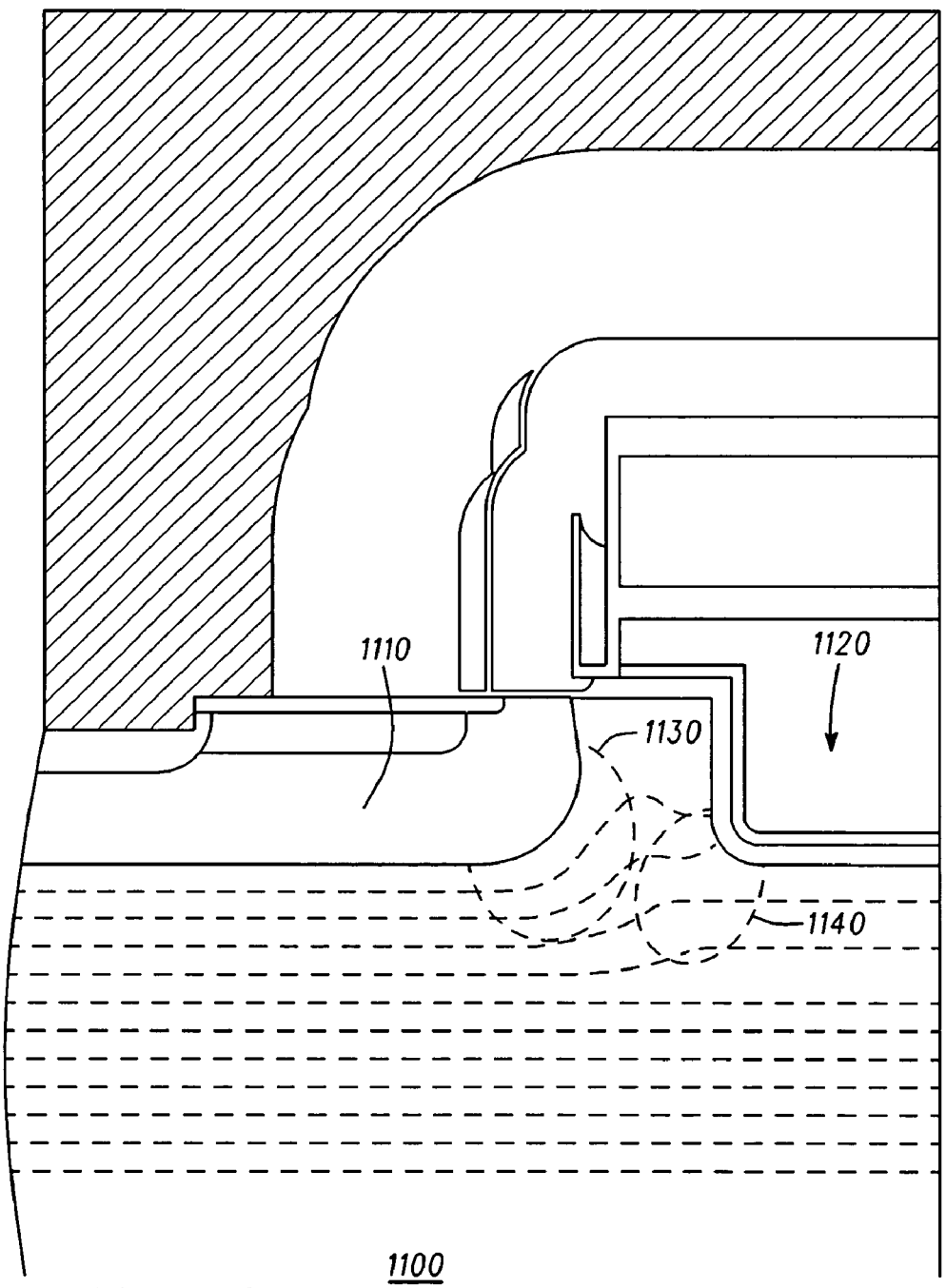
FIGS. 25-26 are exploded cross-sectional views of a portion of a transistor wherein a tub region depth may be approximately equal to a trench depth in accordance with one or more embodiments.

FIG. 25 is an illustration of equal potential field lines in a drain region of a transistor 1100 in accordance with one or more embodiments. The equal potential lines are illustrated as dashed lines. Transistor 1100 has a trench 1120 formed at an approximately equal depth as tub region 1110. The illustration corresponds to a simulation of a device having a breakdown voltage of approximately 110 volts. The field lines are near planar or planar to one another as you move vertically into the drain region past the tub region 1110 and trench 1120. Curvature of the field lines in the drain region occurs in proximity to the drain region between tub region 1110 and trench 1120. Maximum, or nearly maximum, curvature and field strength occur in a region 1130 corresponding to a corner of tub region 1110 and a region 1140 corresponding to a corner of trench 1120.

Figure 26:
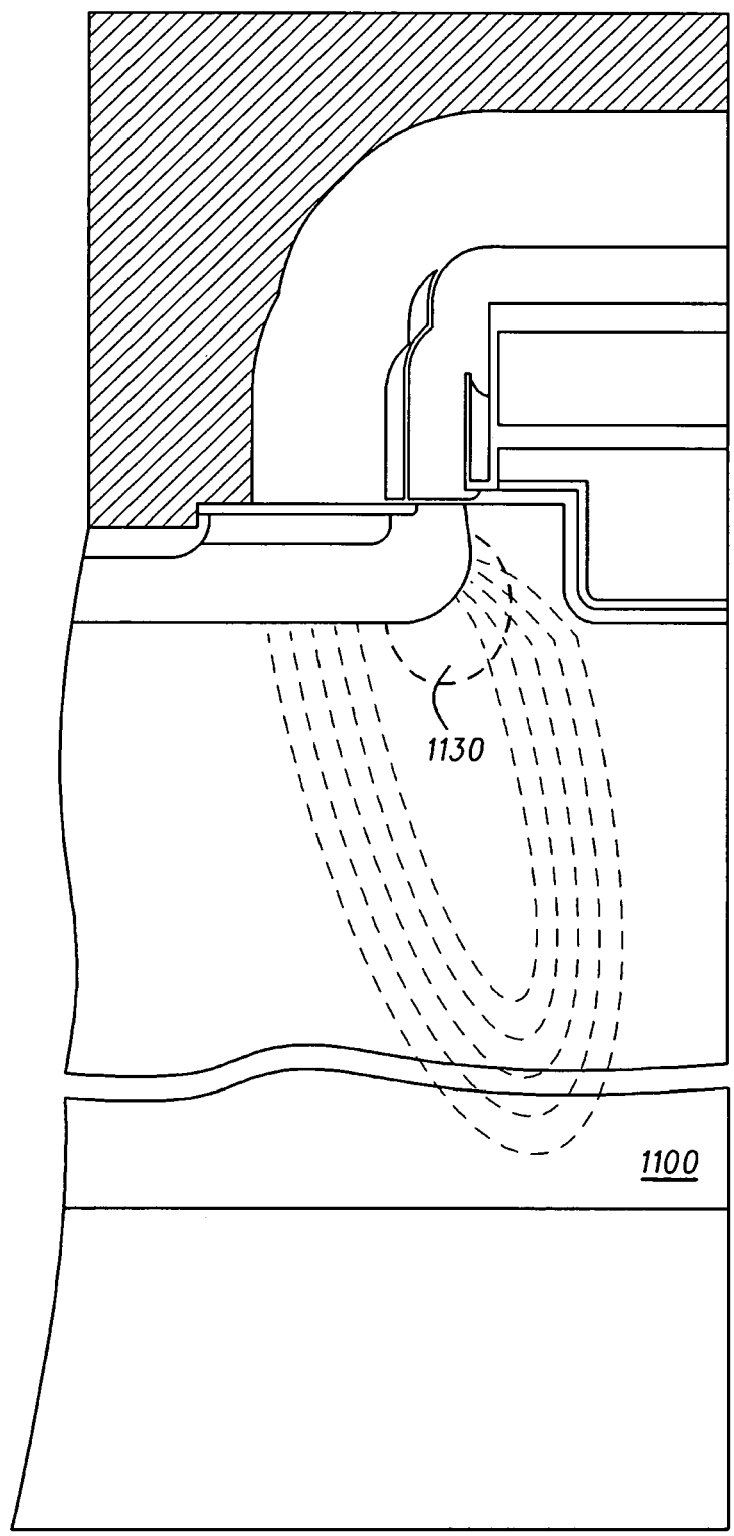

Referring to FIG. 26, impact ionization resulting in avalanche breakdown will be discussed. Note that impact ionization which starts the avalanche occurs in region 1130 in the corner of tub region 1110. This corresponds to an area of substantial field curvature and high field strength. Thus, region 1130 breaks down and avalanches at a lower voltage than a planar breakdown condition and thus is less than optimal. A figure of merit for a transistor is the resistance/(micron of gate width (W)) that may be achieved for a given breakdown voltage. Similar devices may be benchmarked against each other using this figure of merit. A transistor having a lower figure of merit relative to other similar devices will have a smaller die for a predetermined on-resistance or a lower on-resistance for a given die size. Transistor 1100 is simulated having a figure of merit of 45 kilo-ohms/(micron of gate width) with a drain region doping concentration of $2.3 \times 10^{15}$ atoms/cm$^3$ and a voltage breakdown of 110 volts. The simulation has a voltage of one volt across the drain to source to determine the figure of merit.

Figure 27:
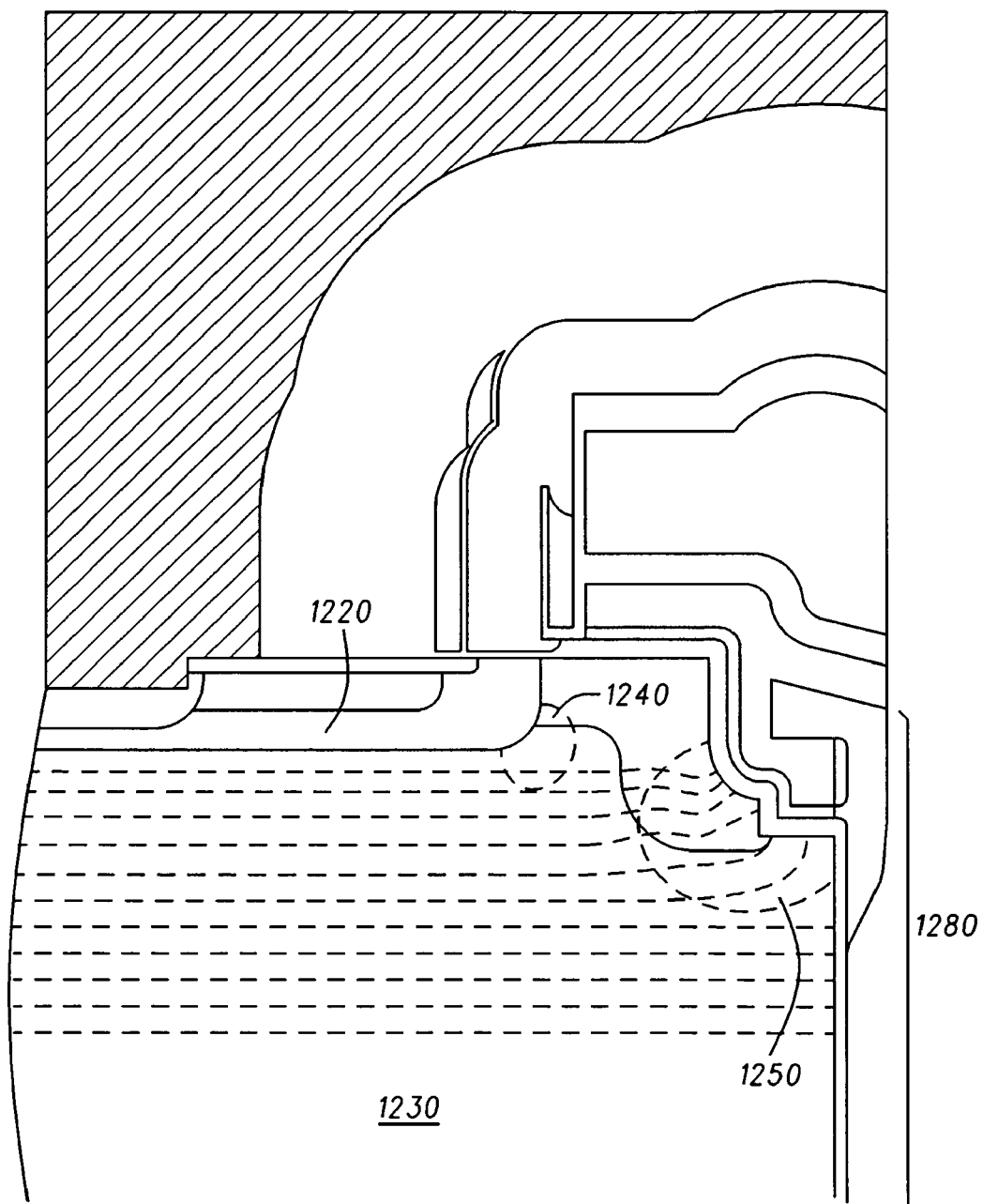
FIGS. 27-28 are exploded cross-sectional views of a portion of a transistor wherein a trench depth may be greater than a tub region depth in accordance with one or more embodiments.

FIG. 27 is a transistor 1200 having near planar or planar breakdown in a drain region 1230 in accordance with one or more embodiments. Simulated equal potential field lines are illustrated in drain region 1230. A region 1240 comprises a p-n junction that is susceptible to avalanche breakdown. Region 1240 comprises a corner region of a junction formed by tub region 1220 and drain region 1230. Under normal operation of transistor 1200, the p-n junction formed by tub region 1220 and drain region 1230 is reverse biased. As described herein above, premature breakdown due to curvature and bunching of the field lines occurs near a corner of a tub region when the tub region of a transistor is formed at a depth less than or equal to a depth of a trench. The spacing between the equal potential field lines increases as the trench depth is increased greater than the depth of the tub region thereby increasing the breakdown voltage of the device.

Planar or near planar breakdown is achieved by moving the area of high field strength from region 1240 to a region that is not a p-n junction, that has very little mobile charge availability, and that may withstand the higher fields without breaking down. The area of high field strength in drain region 1230 is moved to trench 1210 and more particularly to region 1250 of trench 1210. The region of high field strength is moved by forming trench 1210 deeper than tub region 1220. The depth of trench 1210 in relation to tub region 1220 is a function of a number of parameters that include the breakdown voltage of transistor 1200. For example, transistor 1200 simulated for a breakdown voltage in a range of 100-150 volts would have a trench depth to tub region depth ratio greater than two but it will depend on other design parameters of the device. The curvature and bunching of the field lines is readily seen in region 1250 of transistor 1200. Conversely, the field lines are more widely and evenly spaced in region 1240.

In at least one embodiment of transistor 1200, trench 1210 includes a layer of dielectric material adjacent to drain region 1230. Thus, a junction does not exist at region 1250 where high fields exist. In at least one embodiment, a conductive shield is adjacent to the layer of dielectric material to reduce gate to drain capacitance. The dielectric layer is designed to withstand the higher electric fields that occur during transistor 1200 operation such that it is not the voltage breakdown mechanism of the device. In other words, the dielectric layer adjacent to the drain region 1230 in trench 1210 will not breakdown or allow tunneling to occur under high field conditions particularly in region 1250.

Transistor 1200 was simulated having a doping concentration of $2.7 \times 10^{15}$ atoms/cm$^3$ in drain region 1230. This doping concentration is higher than the doping concentration used in the simulation associated with FIGS. 25-26. Moreover, a breakdown voltage of 130 volts was achieved in transistor 1200 which is substantially greater than the 110 volts described in FIGS. 25-26. The beneficial results of increasing trench depth to tub region depth ratio is that transistor 1200 is able to utilize a lower resistivity material in drain region 1230 yet increase the breakdown voltage of the device. The simulation further bears this out with a figure of merit of 31.44 kilo-ohms/(micron of gate width) compared to the 45.45 kilo-ohms/micron(gate width) of FIGS. 25-26. Thus, transistor 1200 has increased packing density, lower on-resistance, and lower parasitic capacitances at the voltage breakdown specification of the device.

Figure 28:
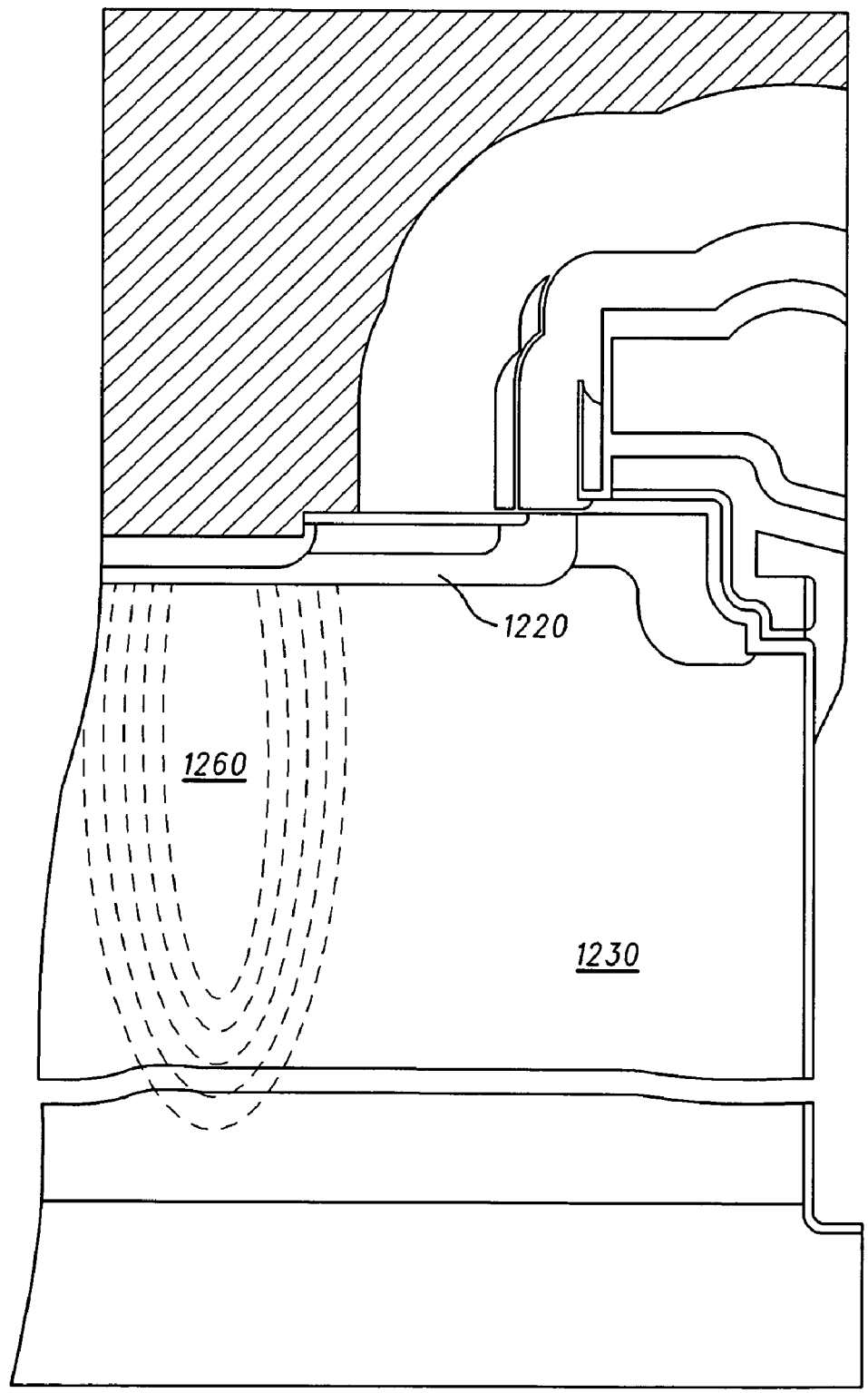

Referring to FIG. 28, impact ionization resulting in avalanche breakdown is shown for a simulation of transistor 1200 in accordance with one or more embodiments. As shown in FIG. 28, impact ionization primarily occurs over a wider area under tub region 1220. This is denoted by a region 1260 of the p-n junction formed by tub region 1220 and drain region 1230. Breakdown over a larger surface area as shown is an indication that planar or near planar breakdown is achieved in transistor 1200. Thus, transistor 1200 is optimized to standoff a maximum voltage over a minimum thickness of drain region 1230.

While the claimed subject matter has been described with reference to one or more embodiments, it is to be understood that the claimed subject matter is not limited to the disclosed embodiments. The scope of the following claims is to be accorded the broadest interpretation so as to encompass all modifications, equivalent structures, and functions of the relevant embodiments. Thus, the description is merely in nature and, thus, variations that do not depart from the gist of the claimed subject matter are intended to be within the scope of the one or more embodiments. Such variations are not to be regarded as a departure from the spirit and scope of the claimed subject matter.

What is claimed is:

1. A semiconductor device, comprising:
   a tub region including a channel region of a transistor, the tub region being disposed at a first depth wherein the tub region has a conductivity type opposite to a conductivity type of a drain region of the transistor;
   a trench formed in the drain region of the transistor to a second depth;
   a dielectric layer overlying the trench;

wherein the second depth is greater than the first depth to reduce a field strength proximate to the tub region to increase a voltage breakdown of the transistor;
a pedestal disposed proximate to the trench;
a first conductive shield disposed in the trench approximately parallel to a sidewall of the trench; and
a second conductive shield at least partially disposed within the pedestal.

2. A semiconductor as claimed in claim 1, wherein a region of maximum or nearly maximum field strength is located at or near a corner region of the trench substantially below a surface of the transistor such that the dielectric layer does not breakdown under the maximum or nearly maximum field strength.

3. A semiconductor as claimed in claim 1, further comprising:
a first dopant of a same type as the drain region implanted in proximity to a surface of the drain region and in proximity to the channel region of the transistor to support current flow out of the channel region and into the drain region; and
a second dopant implanted through a sidewall of the trench to support current flow in proximity to the trench adjacent to the sidewall of the trench.

4. A semiconductor as claimed in claim 1, wherein the first depth of the trench is greater than two times the second depth of the tub region to result in a correspondingly increased breakdown voltage of the transistor.

5. A semiconductor as claimed in claim 1, further comprising a conductive shield disposed in the trench approximately parallel to a sidewall of the trench.

6. A semiconductor as claimed in claim 1, further comprising a second trench at least partially disposed below the trench that is formed in the drain region of the transistor.

7. A semiconductor as claimed in claim 1, wherein the second depth of the trench extends to a region away from a current carrying region of the transistor.

8. A semiconductor device, comprising:
a tub region including a channel region of a transistor, the tub region being disposed at a first depth wherein the tub region has a conductivity type opposite to a conductivity type of a drain region of the transistor;
a trench formed in the drain region of the transistor to a second depth;
a dielectric layer overlying the trench;
wherein the second depth is greater than the first depth to reduce a field strength proximate to the tub region to increase a voltage breakdown of the transistor; and
a second trench at least partially disposed below the trench that is formed in the drain region of the transistor.

9. A semiconductor as claimed in claim 8, wherein a region of maximum or nearly maximum field strength is located at or near a corner region of the trench substantially below a surface of the transistor such that the dielectric layer does not breakdown under the maximum or nearly maximum field strength.

10. A semiconductor as claimed in claim 8, further comprising:
a first dopant of a same type as the drain region implanted in proximity to a surface of the drain region and in proximity to the channel region of the transistor to support current flow out of the channel region and into the drain region; and
a second dopant implanted through a sidewall of the trench to support current flow in proximity to the trench adjacent to the sidewall of the trench.

11. A semiconductor as claimed in claim 8, wherein the first depth of the trench is greater than two times the second depth of the tub region to result in a correspondingly increased breakdown voltage of the transistor.

12. A semiconductor as claimed in claim 8, further comprising a conductive shield disposed in the trench approximately parallel to a sidewall of the trench.

13. A semiconductor as claimed in claim 8, further comprising:
a pedestal disposed proximate to the trench;
a first conductive shield disposed in the trench approximately parallel to a sidewall of the trench; and
a second conductive shield at least partially disposed within the pedestal.

14. A semiconductor as claimed in claim 8, wherein the second depth of the trench extends to a region away from a current carrying region of the transistor.

* * * * *